(12) United States Patent
Miura

(10) Patent No.: US 7,709,920 B2
(45) Date of Patent: May 4, 2010

(54) PHOTODIODE ARRANGEMENT

(75) Inventor: Noriyuki Miura, Kanagawa (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 133 days.

(21) Appl. No.: 11/979,902

(22) Filed: Nov. 9, 2007

(65) Prior Publication Data
US 2008/0111205 A1 May 15, 2008

(30) Foreign Application Priority Data
Nov. 14, 2006 (JP) ............................. 2006-308282
Feb. 23, 2007 (JP) ............................. 2007-044465

(51) Int. Cl.
*H01L 31/105* (2006.01)

(52) U.S. Cl. ....................... 257/440; 257/290; 257/458; 257/464; 257/E31.061; 257/E31.062

(58) Field of Classification Search ......... 257/290–294, 257/440, 443, 444, 458, 461–465, E31.061, 257/E31.062
See application file for complete search history.

(56) References Cited

U.S. PATENT DOCUMENTS 3,994,012 A * 11/1976 Warner, Jr. .................. 136/246
4,972,252 A    11/1990 Maekawa et al.
5,726,440 A *  3/1998 Kalkhoran et al. ........ 250/214.1
2008/0296642 A1* 12/2008 Miura ......................... 257/292

FOREIGN PATENT DOCUMENTS

JP           07-162024        6/1995

* cited by examiner

*Primary Examiner*—Jerome Jackson, Jr.
*Assistant Examiner*—Yu Chen
(74) *Attorney, Agent, or Firm*—Rabin & Berdo, P.C.

(57) ABSTRACT

A photodiode that can separately detect the intensities of the three wavelength ranges of ultraviolet light of 400 nm or below includes an insulating layer; and a plurality of silicon semiconductor layers having different thicknesses formed on the insulating layer, wherein each of the plurality of silicon semiconductor layers has a low-concentration diffusion layer formed by diffusing one of a P-type impurity or an N-type impurity therein with a low concentration; a P-type high-concentration diffusion layer formed by diffusing a P-type impurity therein with a high concentration; and an N-type high-concentration diffusion layer formed by diffusing an N-type impurity therein with a high concentration, and wherein the P-type high-concentration diffusion layer and the N-type high-concentration diffusion layer formed in a respective one of the plurality of silicon semiconductor layers are arranged to face each other with the low-concentration diffusion layer interposed there between.

14 Claims, 15 Drawing Sheets

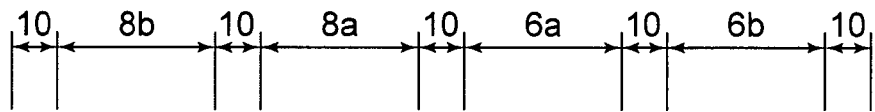
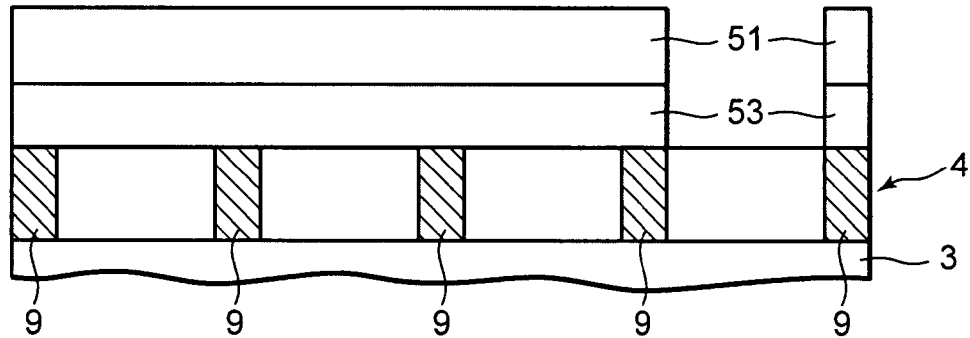
(P1)
FIG. 3A
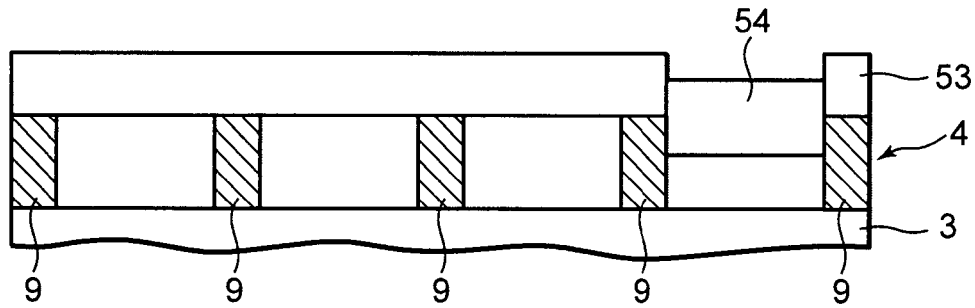
(P2)
FIG. 3B
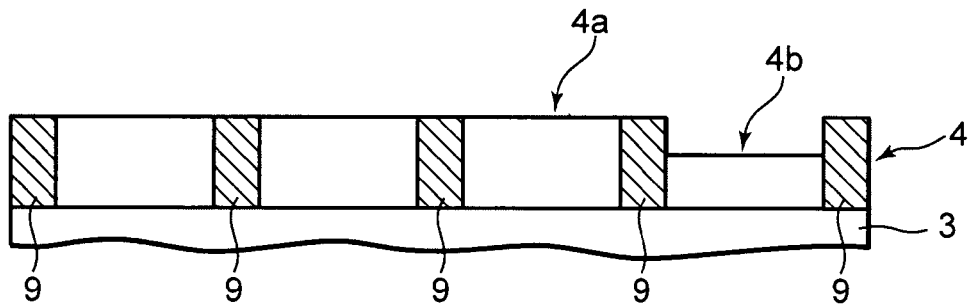
(P3)
FIG. 3C
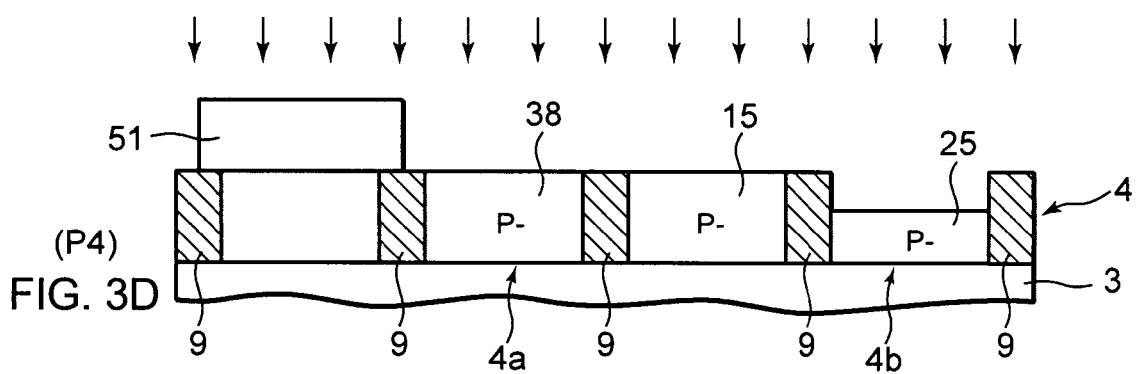
(P4)
FIG. 3D

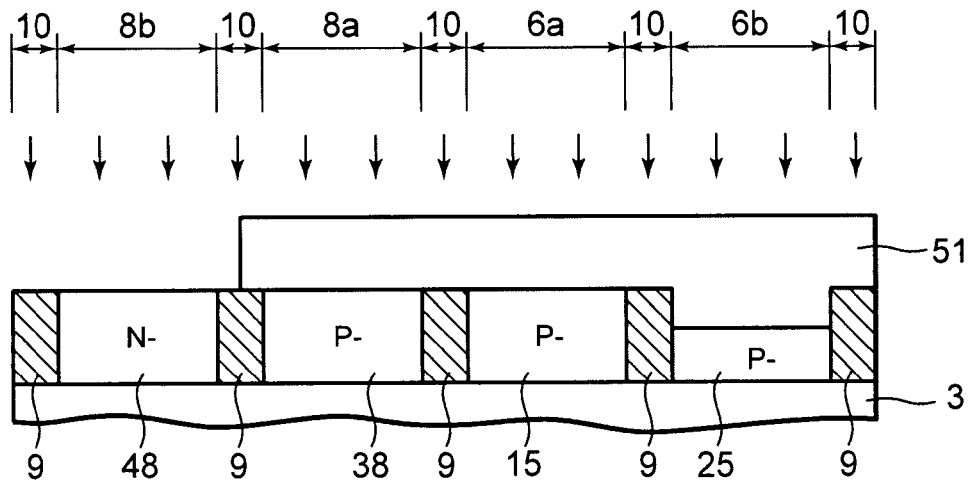
FIG. 4A (P5)
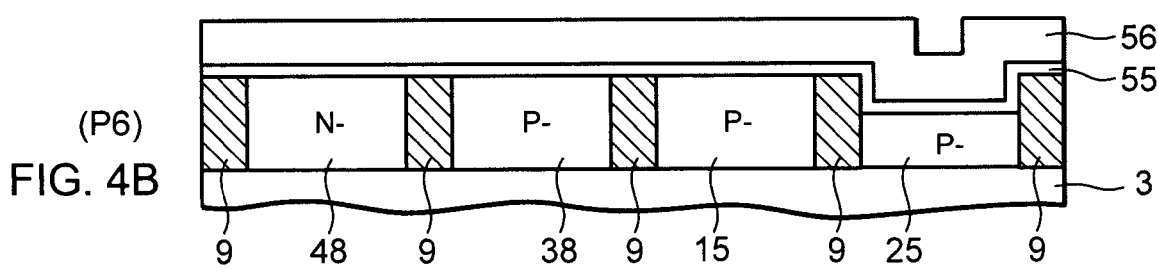
FIG. 4B (P6)
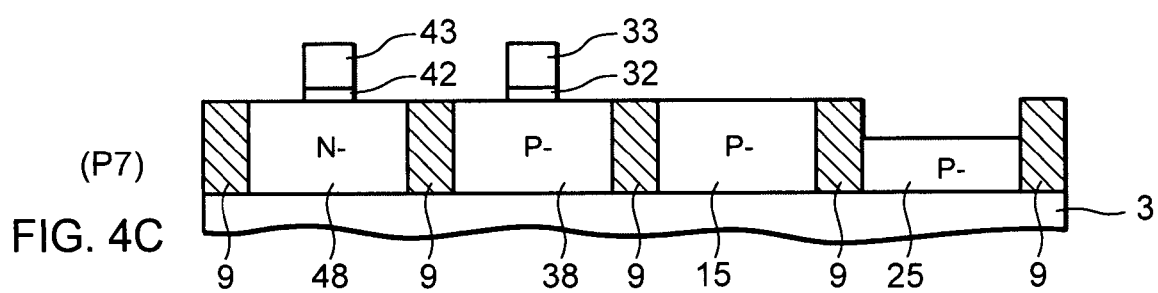
FIG. 4C (P7)
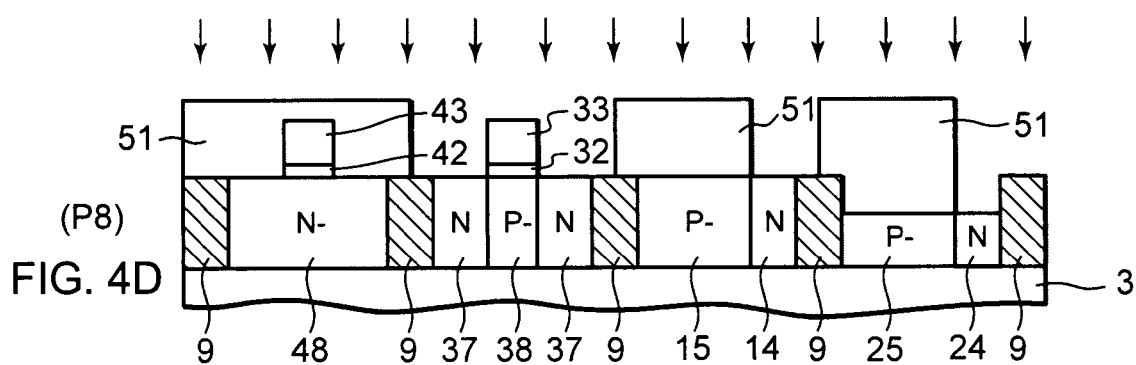
FIG. 4D (P8)

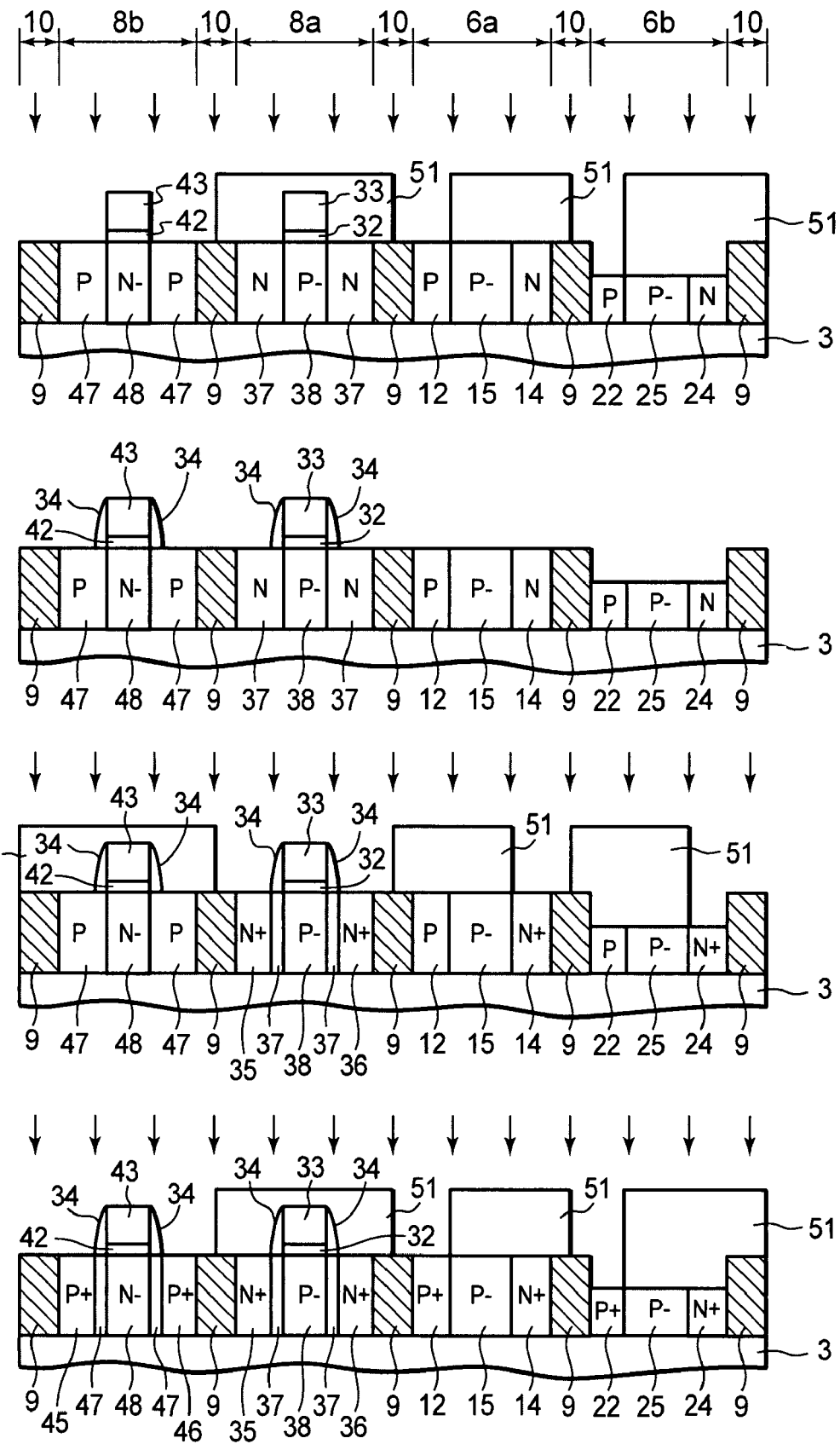
FIG. 5A (P9)
FIG. 5B (P10)
FIG. 5C (P11)
FIG. 5D (P12)

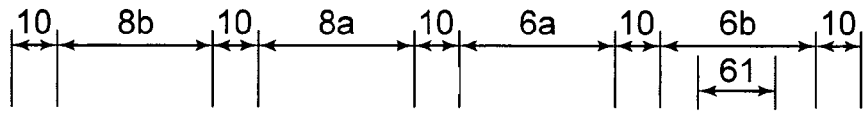
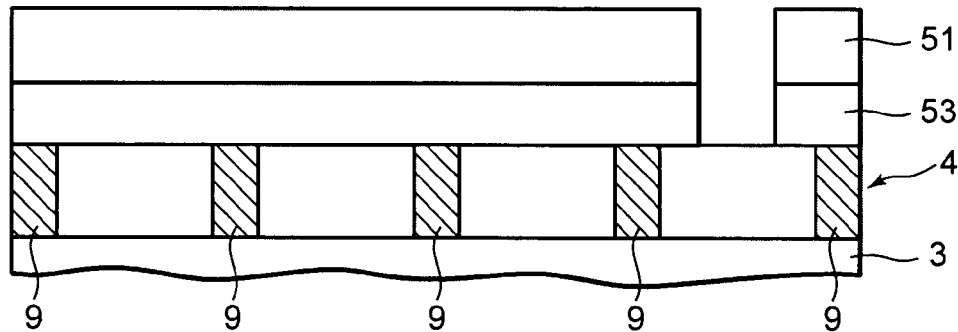
(PA1) FIG. 14A
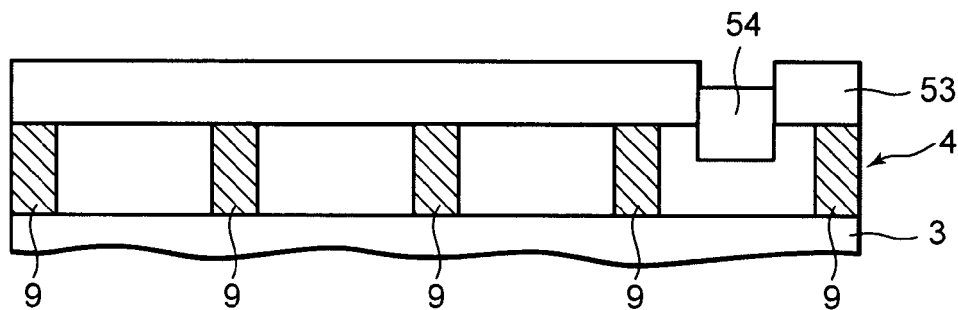
(PA2) FIG. 14B
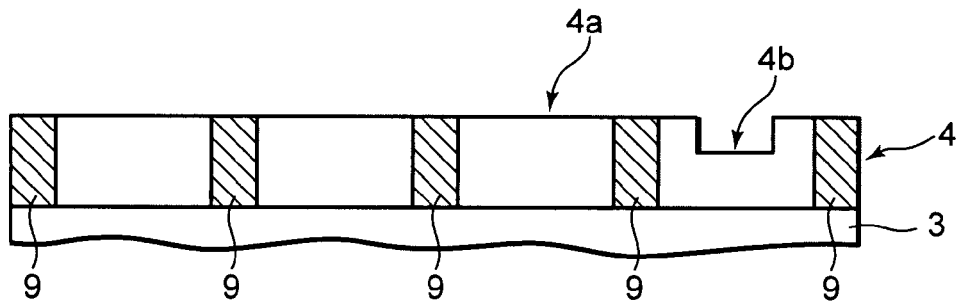
(PA3) FIG. 14C
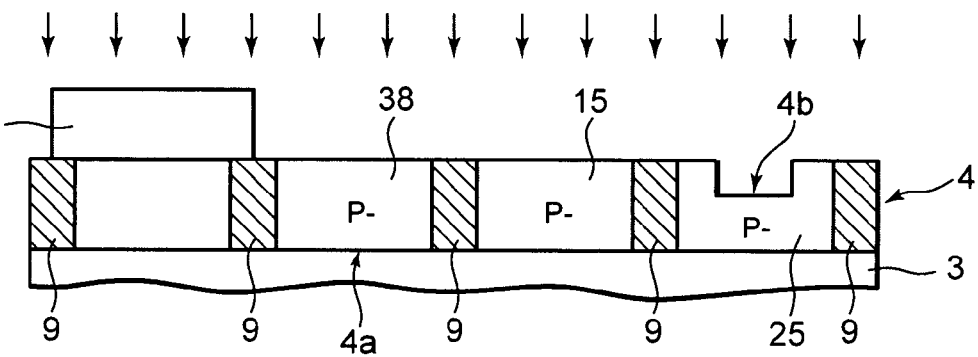
(PA4) FIG. 14D

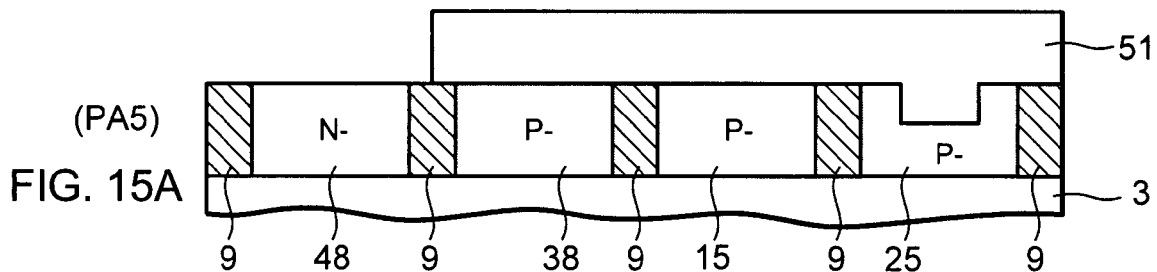
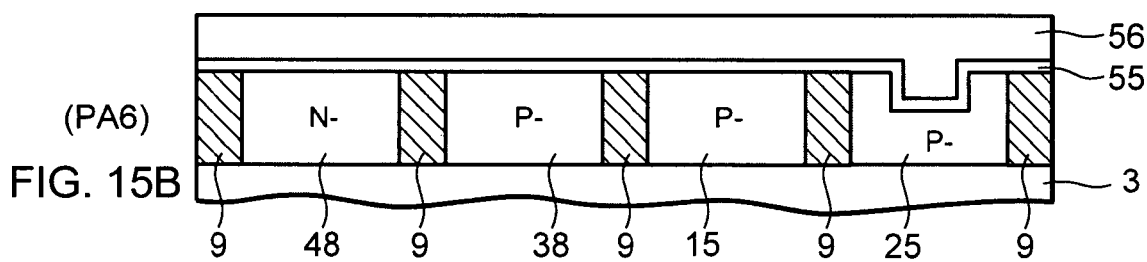
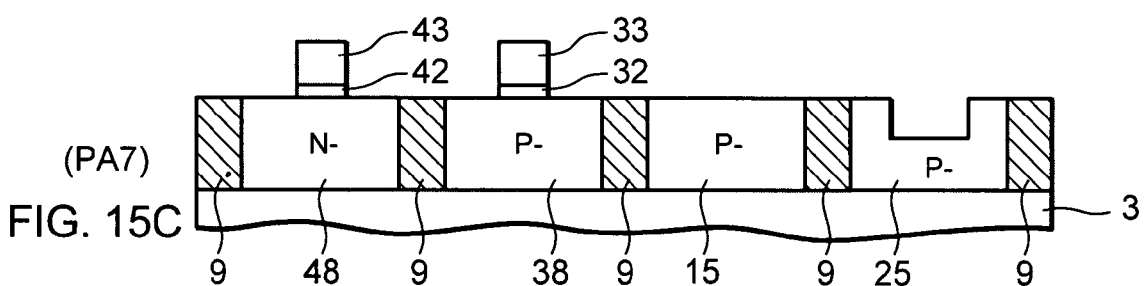
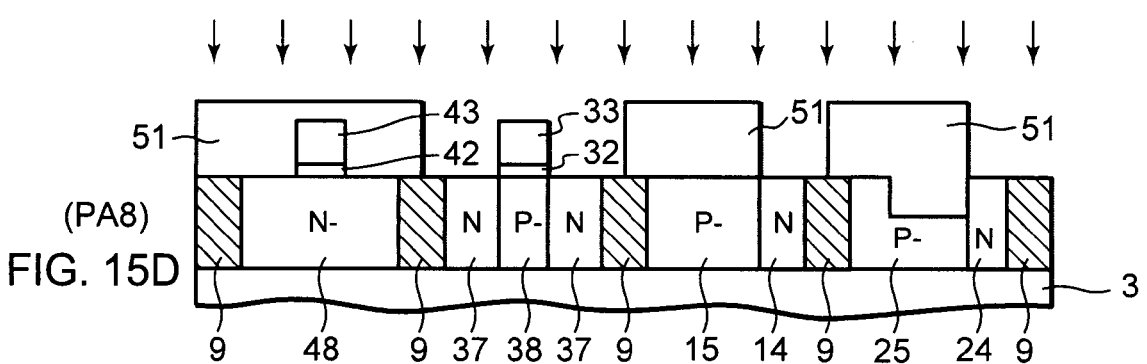

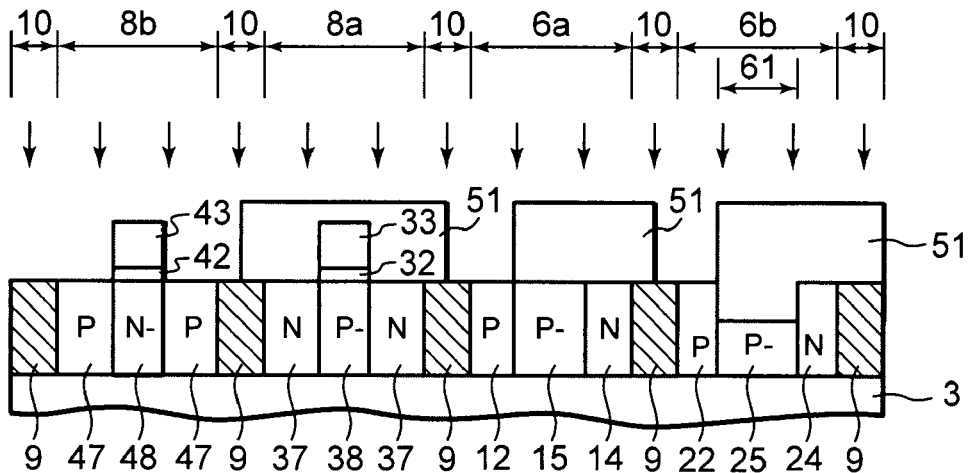
FIG. 16A (PA9)
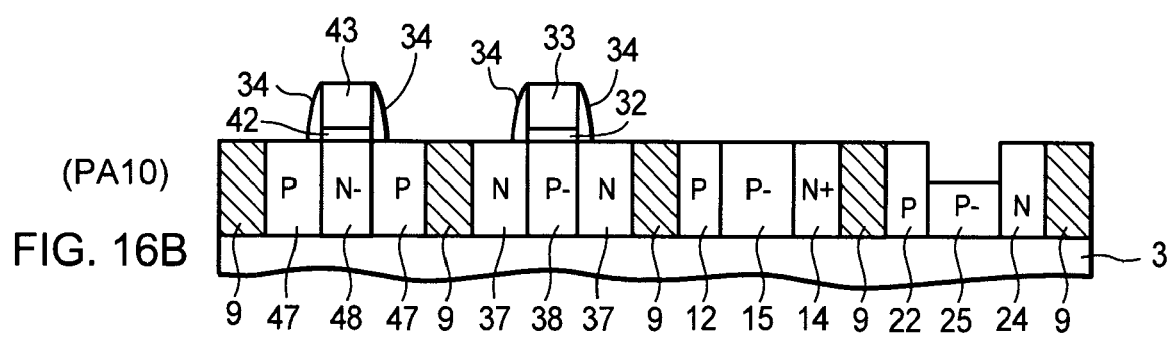
FIG. 16B (PA10)
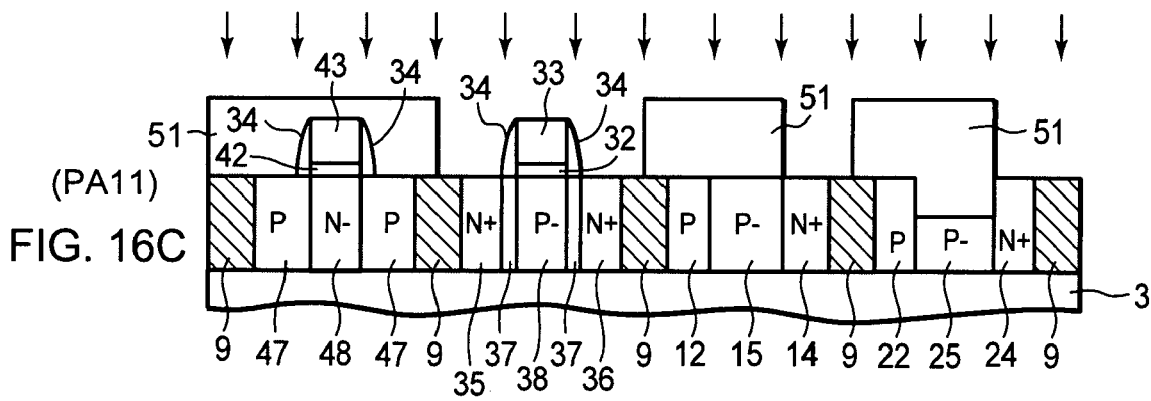
FIG. 16C (PA11)
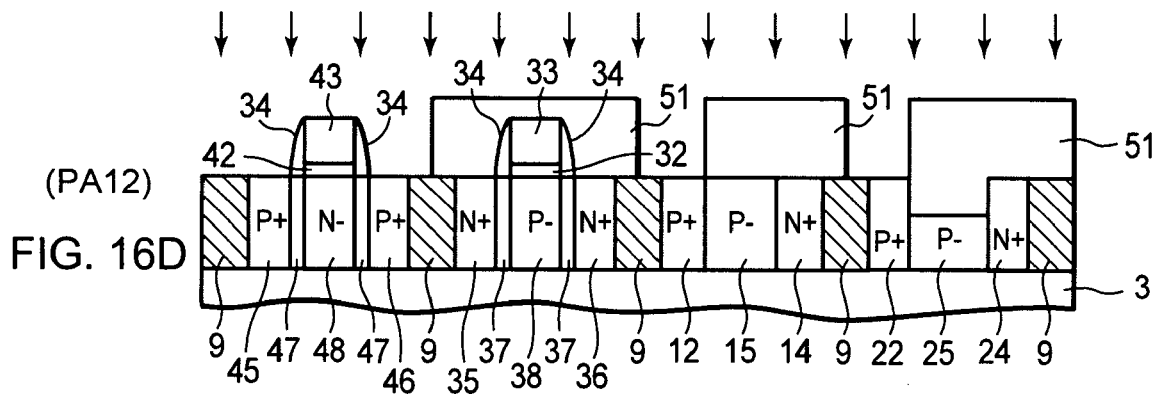
FIG. 16D (PA12)

PHOTODIODE ARRANGEMENT

BACKGROUND OF THE INVENTION

1. Field of the Invention

The present invention relates to a photodiode arrangement which receives light, especially ultraviolet rays to generate a current.

2. Description of the Related Art

In a conventional photodiode, an N+ diffusion layer which has an N-type impurity diffused therein with a high concentration and is formed into a comb shape like "E" and a P+ diffusion layer which has a P-type impurity diffused therein with a high concentration and is formed into a shape like "π" are laterally arranged to face each other in a silicon semiconductor layer having an N-type impurity diffused therein with a low concentration on an SOI (Silicon On Insulator) substrate which has the silicon semiconductor layer with a thickness of approximately 150 nm formed on a silicon substrate to sandwich a buried oxide film there between in such a manner that a comb tooth portion of the N+ diffusion layer meshes with a comb tooth portion of the P+ diffusion layer, and a predetermined voltage is applied to a metal wiring line electrically connected with the N+ diffusion layer and the P+ diffusion layer to detect an intensity of an ultraviolet ray (see, e.g., Japanese Patent Application Laid-open No. 162024-1995, p. 4, paragraph 0025-p. 4, paragraph 0035, and FIGS. 2 and 3).

At the present time, the amount of ultraviolet irradiation is increasing due to destruction of the ozone layer and concern over the influence of ultraviolet rays contained in solar light on the human body and/or the environment is increasing.

In general, an ultraviolet ray is invisible light in an ultraviolet range of a wavelength of 400 nm or below. The ultraviolet ray is classified into a long-wave ultraviolet ray (an UV-A wave: a wavelength of approximately 320 to 400 nm), a medium-wave ultraviolet ray (an UV-B wave: a wavelength of approximately 280 to 320 nm), and a short-wave ultraviolet ray (an UV-C wave: a wavelength of approximately 280 nm or below). The influence on the human body and/or the environment varies depending on these wavelength ranges. It is considered that the UV-A wave darkens skin and reaches inner skin to cause aging, the UV-B wave inflames skins to possibly provoke skin cancer, and the UV-C wave has a strong bactericidal function but is absorbed in the ozone layer.

Therefore, demand for development of a sensor which separates ultraviolet rays in these three wavelength ranges and detects intensities of these ultraviolet rays has increased.

However, in the above-explained conventional technology, although a total amount of ultraviolet rays in the ultraviolet range of the wavelength of 400 nm or below can be detected, the three wavelength ranges have not as yet been separated for detection.

SUMMARY OF THE INVENTION

In view of the above-explained problem, it is an object of the present invention to provide a photodiode arrangement which can separate the three wavelength ranges of ultraviolet rays to detect respective intensities thereof.

This object is achieved according to a first embodiment of the present invention which provides a photodiode arrangement comprising an insulating layer; and a plurality of silicon semiconductor layers having different thicknesses formed on the insulating layer, wherein each of the plurality of silicon semiconductor layers has a low-concentration diffusion layer formed by diffusing one of a P-type impurity or an N-type impurity therein with a low concentration; a P-type high-concentration diffusion layer formed by diffusing a P-type impurity therein with a high concentration; and an N-type high-concentration diffusion layer formed by diffusing an N-type impurity therein with a high concentration, and wherein the P-type high-concentration diffusion layer and the N-type high-concentration diffusion layer formed in a respective one of the plurality of silicon semiconductor layers are arranged to face each other with the low-concentration diffusion layer formed in said respective one of the plurality of silicon semiconductor layers interposed therebetween.

The object is additionally achieved according to a second embodiment of the present invention which provides a photodiode arrangement comprising an insulating layer; a first silicon semiconductor layer formed on the insulating layer; a second silicon semiconductor layer which is formed on the insulating layer and which has a thickness which is less than that of the first silicon semiconductor layer; a first photosensitive element which is formed in the first silicon semiconductor layer and in which a first P-type high-concentration diffusion layer having a P-type impurity diffused therein with a high concentration and a first N-type high-concentration diffusion layer having an N-type impurity diffused therein with a high concentration are arranged to face each other with a first low-concentration diffusion layer having one of a P-type impurity or an N-type impurity diffused therein with a low concentration interposed therebetween; and a second photosensitive element in which a second P-type high-concentration diffusion layer having a P-type impurity diffused therein with a high concentration and a second N-type high-concentration diffusion layer having an N-type impurity diffused therein with a high concentration are arranged to face each other with a second low-concentration diffusion layer having one of a P-type impurity or an N-type impurity diffused therein with a low concentration interposed therebetween, wherein the second low-concentration diffusion layer is formed in the second silicon semiconductor layer.

As a result, according to the present invention, ultraviolet rays in the three wavelength ranges can be separated to obtain intensities thereof based on a calculation of outputs from photosensitive elements formed in the respective silicon semiconductor layers having different thicknesses, and it is possible to obtain an effect of readily providing the photodiode arrangement which can separate ultraviolet rays in the three wavelength ranges to detect intensities thereof.

BRIEF DESCRIPTION OF THE DRAWINGS

FIGS. 3A-3D is series of steps (P1)-(P4), respectively, showing in cross section a manufacturing method of a photo IC according to Embodiment 1 of the present invention;

FIGS. 4A-4D is a series of additional steps (P5)-(P8), respectively, showing in cross section the manufacturing method of the photo IC according to Embodiment 1;

FIGS. 5A-5D is a series of additional steps (P9)-(P12), respectively, showing in cross section the manufacturing method of the photo IC according to Embodiment 1;

FIGS. 14A-14D is a series of steps (PA1)-(PA4), respectively, showing in cross section a manufacturing method of a photo IC according to Embodiment 2 of the present invention;

FIGS. 15A-15D is a series of additional steps (P5)-(P8), respectively, showing in cross section the manufacturing method of the photo IC according to Embodiment 2;

FIGS. 16A-16D is a series of additional steps (PA9)-(PA12), respectively, showing in cross section the manufacturing method of the photo IC according to Embodiment 2;

DETAILED DESCRIPTION OF THE INVENTION

Embodiments of a photodiode arrangement according to the present invention will now be explained hereinafter with reference to the accompanying drawings.

Embodiment 1

Figure 1:
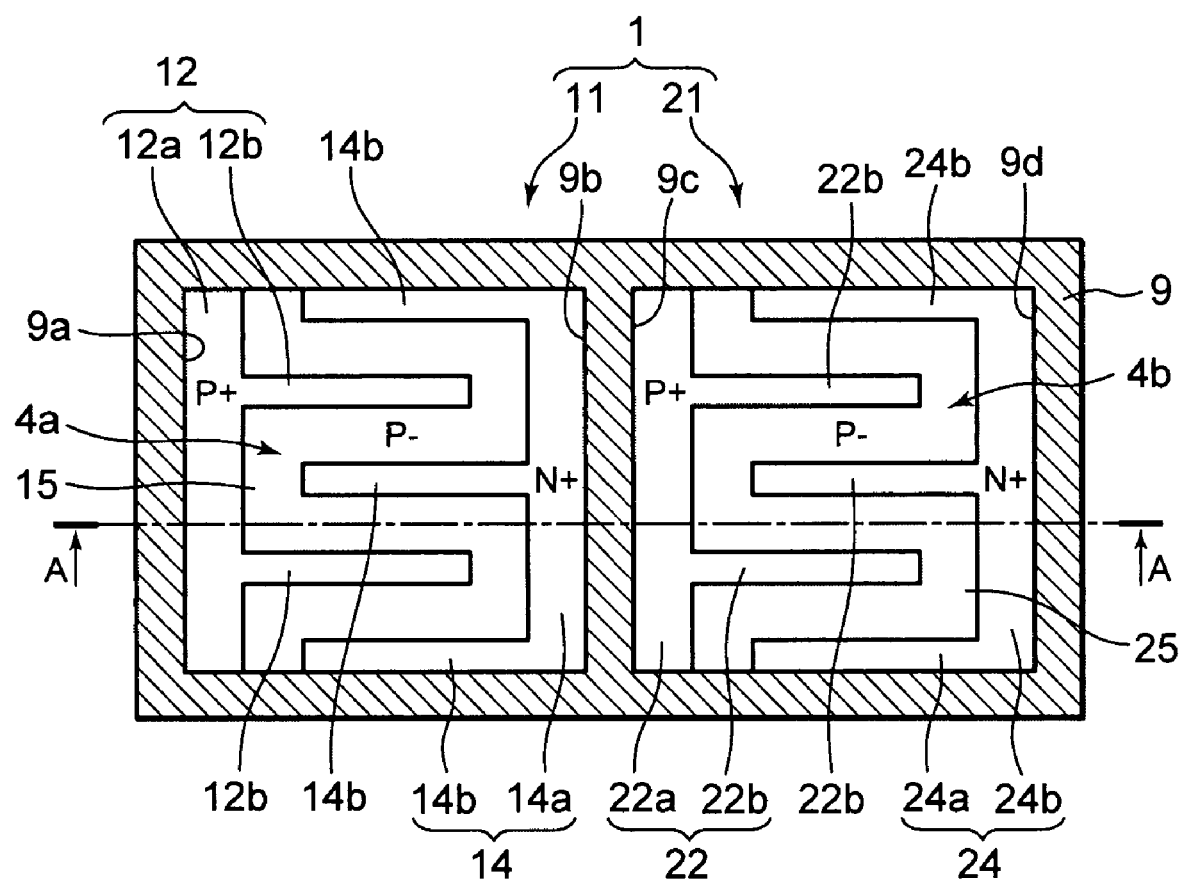
FIG. 1 is an explanatory drawing showing a top face of a photodiode arrangement according to Embodiment 1.
Figure 2:
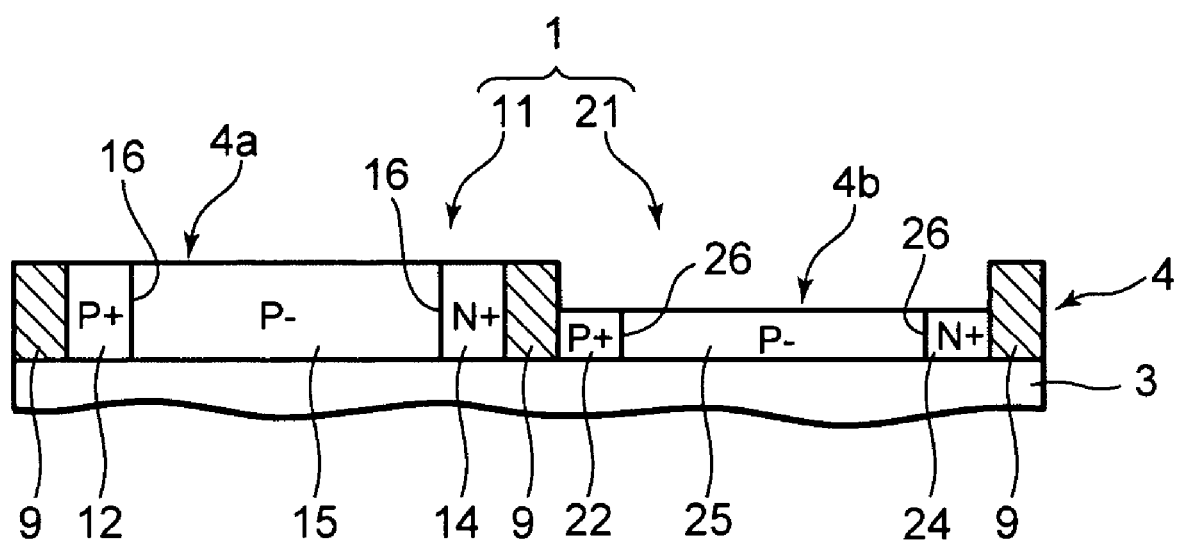
FIG. 2 is an explanatory drawing showing a cross section of the photodiode arrangement according to Embodiment 1.

FIG. 1 is an explanatory drawing showing a top face of a photodiode according to Embodiment 1, FIG. 2 is an explanatory drawing showing a cross section of the photodiode arrangement according to Embodiment 1, and FIGS. 3A-3D, 4A-4D, 5A-5D, and 6 are explanatory drawings showing a manufacturing method of a photo IC according to Embodiment 1.

It is to be noted that FIG. 2 is a cross-sectional view taken along a cutting-plane line A-A in FIG. 1.

In FIGS. 1 and 2, reference numeral 1 denotes a photodiode arrangement (generally referred to simply as a photodiode for the remainder of this specification), and it is constituted of first and second photosensitive elements 11 and 21 formed in first and second silicon semiconductor portions 4a and 4b with different thicknesses of a semiconductor wafer having an SOI structure in which a silicon semiconductor layer 4 composed of single-crystal silicon with a small thickness is formed on a silicon substrate (not shown) made of silicon (Si) to sandwich a buried oxide film 3 as an insulating layer formed of a silicon oxide ($SiO_2$) therebetween. The first and second silicon semiconductor portions 4a and 4b will be generally referred to simply as first and second silicon semiconductor layers for the remainder of this specification.

The thicknesses of the first and second silicon semiconductor layers 4a and 4b according to this embodiment are set to gradually different thicknesses in a thickness range of 50 nm or below to separate ultraviolet rays in three wavelength ranges in an ultraviolet range of a wavelength of 400 nm or below and to detect intensities of these ultraviolet rays.

That is, an optical absorption ratio I/Io in silicon is represented by the following expression using an optical absorption coefficient α based on Beer's theory:

$$I/Io = \exp(-\alpha Z) \quad (1)$$

where Z is an entering depth of light, I is a light intensity at the depth Z, and Io is an incident light intensity.

Figure 7:
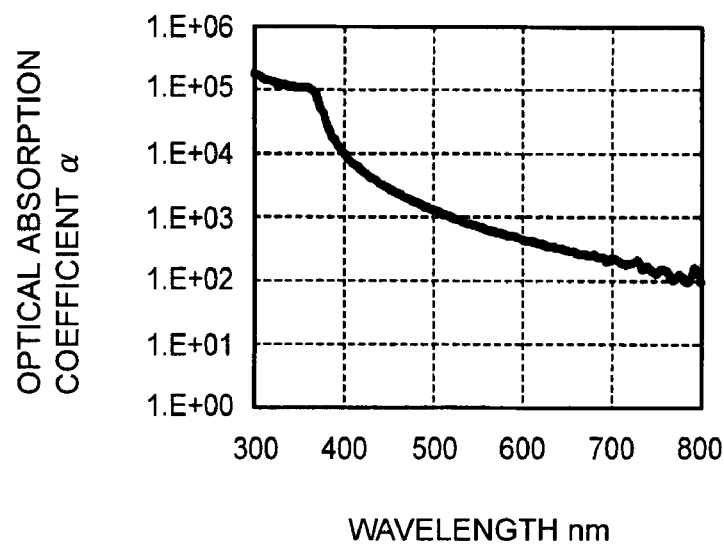
FIG. 7 is a graph showing wavelength dependence of an optical absorption coefficient of silicon (100)
Figure 8:
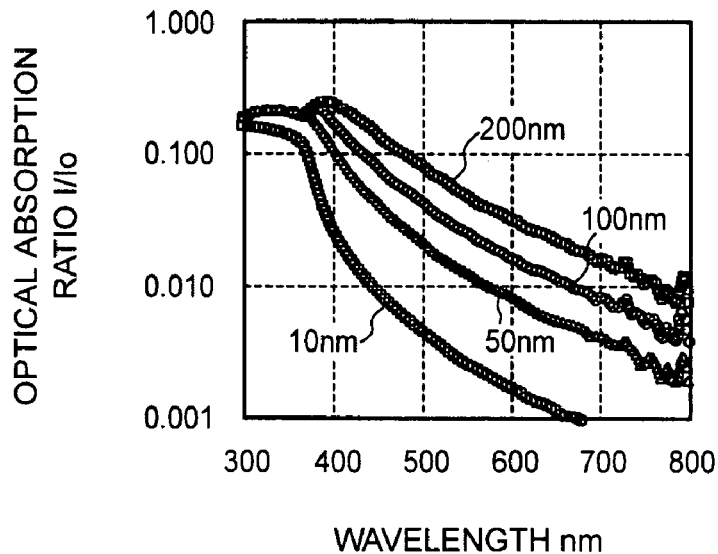
FIG. 8 is a graph showing an optical absorption ratio depending on a thickness of a silicon semiconductor layer.
Figure 9:
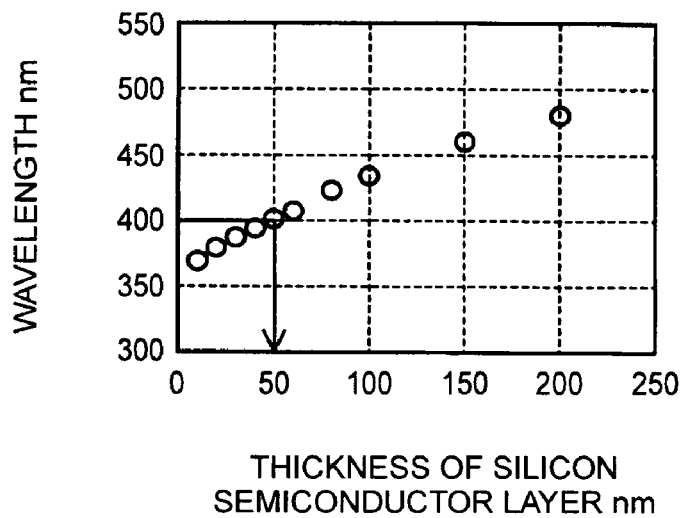
FIG. 9 is a graph showing a wavelength with which an optical absorption ratio becomes 10%.

The optical absorption coefficient α has wavelength dependence as shown in FIG. 7, and such a graph as depicted in FIG. 8 can be obtained when Expression (1) is used to obtain the optical absorption ratio I/Io in accordance with each thickness (Z) of the silicon semiconductor layer 4.

As shown in FIG. 8, it can be understood that, when the optical absorption ratio I/Io becomes 0.1 or below, i.e., 10% or below, the optical absorption coefficient I/Io is precipitously reduced, and its wavelength shifts in a direction of a short wavelength, i.e., an ultraviolet range direction as the thickness is decreased.

When a wavelength with which the optical absorption ratio I/Io with respect to the thickness of the silicon semiconductor layer 4 becomes 10% is obtained to utilize this property, it can be understood that setting the thicknesses of the first and second silicon semiconductor layers 4a and 4b to different thicknesses in a thickness range of 50 nm or below can suffice in order to selectively provide a sensitivity in an ultraviolet range of a wavelength 400 nm or below.

Therefore, it is desirable to set the thickness of the silicon semiconductor layer 4 to 50 nm or below in order to selectively detect the ultraviolet range alone, and setting a lower limit of this thickness to 3 nm is preferable.

The thickness of the silicon semiconductor layer 4 is set to 3 nm or above because assimilating irregularities in thickness when forming the silicon semiconductor layer 4 in the semiconductor wafer becomes difficult if the thickness is smaller than this value.

The first silicon semiconductor layer 4a according to this embodiment is formed with a thickness larger than that of the second silicon semiconductor layer 4b, and the first silicon semiconductor layer 4a has a thickness of 35 nm whilst the second silicon semiconductor layer 4b has a thickness of 10 nm.

As shown in FIGS. 3A-3D, 4A-4D, 5A-5D, and 6, a first diode forming region 6a where the first photosensitive element 11 of the photodiode 1 is formed and transistor forming regions 8a and 8b where an nMOS element 31 and a pMOS element 41 as MOSFETs (Metal Oxide Semiconductor Field Effect Transistors) are formed are set on the first silicon semiconductor layer 4a whose thickness is set as explained above, and a second diode forming region 6b where the second photosensitive element 21 of the photodiode 1 is formed is set on the second silicon semiconductor layer 4b.

Further, an element isolating region 10 where element isolating layer pattern 9 (generally referred to simply as element isolating layer 9 in the remainder of this specification) is set in a rectangular frame-like region surrounding each of the first and second diode forming regions 6a and 6b and the transistor forming regions 8a and 8b.

The element isolating layer 9 is formed of an insulating material, e.g., a silicon oxide in the first silicon semiconductor layer 4a having the large thickness in the element isolating region 10 to reach a buried oxide film 3, and it has the function of electrically isolating the neighboring first and second diode forming regions 6a and 6b of the first and second silicon semiconductor layers 4a and 4b and the neighboring transistor forming regions 8a and 8b of the first silicon semiconductor layer 4a from each other.

It is to be noted that, as shown in FIGS. 1, 2 and others, the element isolating layer 9 is shown with hatching for discrimination in this explanation.

The first photosensitive element 11 according to this embodiment is formed in the first diode forming region 6a set in the first silicon semiconductor layer 4a having the large thickness.

Reference numeral 12 denotes a first P+ diffusion layer or region as a P-type high-concentration diffusion layer which is a diffusion layer formed by diffusing a P-type impurity, e.g., boron (B) in the first silicon semiconductor layer 4a in the first diode forming region 6a with a relatively high concentration. As shown in FIG. 1, the first P+ diffusion layer 12 is formed into a comb-like shape including a peak portion 12a which is in contact with one side 9a on the inner side of the element isolating layer 9a and a plurality of comb tooth portions 12b extending from the peak portion 12a toward the other side 9b on the inner side of the element isolating layer 9 facing the one side 9a.

The first P+ diffusion layer 12 according to this embodiment is formed into a shape like "π" by extending the two comb tooth portions 12b from the peak portion 12a.

Reference numeral 14 denotes a first N+ diffusion layer or region as an N-type high-concentration diffusion layer which is a diffusion layer formed by diffusing an N-type impurity, e.g., phosphorus (P) or arsenic (As) which is the type opposite to that of the P-type high-concentration diffusion layer in the first silicon semiconductor layer 4a in the first diode forming region 6a with a relatively high concentration. As shown in FIG. 1, the first N-type diffusion layer 14 is formed into a comb-like shape including a peak portion 14a which is in contact with the other side 9b on the inner side of the element isolating layer 9 and a plurality of comb tooth portions 14b extending from the peak portion 14a toward the one side 9a facing the other side 9b. Doped diffusion regions will frequently be referred to as diffusion layers for the remainder of this specification.

The first N+ diffusion layer 14 according to this embodiment is formed into a shape like "E" by extending the three comb tooth portions 14b from both ends and a center of the peak portion 14a.

Reference numeral 15 denotes a first P− diffusion layer or region as a low-concentration diffusion layer which is a diffusion layer formed by diffusing a P-type impurity with a relatively low concentration in the first silicon semiconductor layer 4a which is in contact with the first P+ diffusion layer 12 and the first N+ diffusion layer 14 arranged to face each other in such a manner that the comb tooth portions 12b and 14b mesh with each other with a gap therebetween. The first P− diffusion layer is a part where each pair of an electron and a hole is produced by an ultraviolet ray absorbed in a depletion layer formed therein.

With such a structure, as shown in FIG. 1, the first photosensitive element 11 of the photodiode 1 according to this embodiment is formed in such a manner that the first P+ diffusion layer 12 and the first N+ diffusion layer 14 are oppositely arranged to sandwich the first P− diffusion layer 15 with the respective comb tooth portions 12b and 14b meshing with each other and rims except boundaries 16 with respect to the first P− diffusion layer 15 are in contact with the element isolating layer 9.

The second photosensitive element 21 according to this embodiment is formed in the second diode forming region 6b set in the second silicon semiconductor layer 4b with the small thickness like the first photosensitive element 11. As shown in FIGS. 1 and 2, the second photosensitive element 21 includes a second P+ diffusion layer or region as a P-type high-concentration diffusion layer and a second N+ diffusion layer or region 24 as an N-type high-concentration diffusion layer. The second P+ diffusion layer or region 22 is formed into a comb shape like "π" with a plurality of comb tooth portions 22b extending from a peak portion 22a which is in contact with one side 9c on the inner side of the element isolating layer 9 toward the other side 9d on the inner side of the element isolating layer 9 facing the one side 9c, and has a P-type impurity diffused therein with a relatively high concentration. The second N+ diffusion layer 24 is formed into a comb shape like "E" with a plurality of comb tooth portions 24b extending from a peak portion 24a which is in contact with the other side 9d on the inner side of the element isolating layer 9 toward the opposed one side 9c, and has an N-type impurity diffused therein with a relatively high concentration. The second P+ diffusion layer 22 and the second N+ diffusion layer 24 are arranged to face each other with their comb tooth portions 22b and 24b meshing each other. The second photosensitive element 21 also includes a second P− diffusion layer 25 as a low-concentration diffusion layer which is interposed between the second P+ diffusion layer 22 and the second N+ diffusion layer 24, is in contact with each boundary 26, and has a P-type impurity diffused therein with a relatively low concentration.

Figure 6:
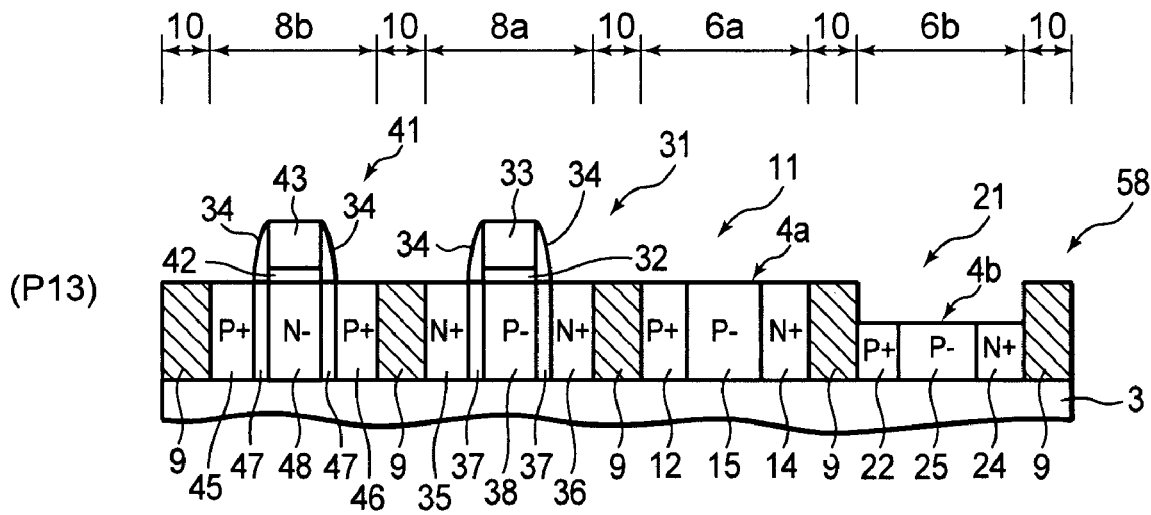
FIG. 6 illustrates step (P13) in cross section of the manufacturing method of the photo IC according to Embodiment 1.

As shown in FIG. 6, (P13), the first and second photosensitive elements 11 and 21 according to this embodiment are formed together with an nMOS element 31 and a pMOS element 41 formed on the first silicon semiconductor layer 4a.

The nMOS element 31 according to this embodiment is formed in the transistor forming region 8a set in the first silicon semiconductor layer 4a having the large thickness.

In FIG. 6, (P13), reference numeral 32 denotes a gate oxide film, and it is an insulating film which is formed of an insulating material, e.g., a silicon oxide and has a relatively small film thickness.

Reference numeral 33 designates a gate electrode, and it is an electrode formed of, e.g., polysilicon in which an impurity that is of the same type as a source layer or region 35 (which will be explained later) (the N type in this embodiment) is diffused with a relatively high concentration. The gate electrode 33 is formed at a central part of the transistor forming region 8a in a gate length direction to face the first silicon semiconductor layer 4a in the transistor forming region 8a with the gate oxide film 32 being sandwiched therebetween, and a sidewall 34 formed of an insulating material, e.g., a silicon nitride ($Si_3N_4$) is formed on a side surface of the gate electrode 33.

The source layer 35 and a drain layer or region 36 in which the N-type impurity is diffused with a relatively high concentration are formed in the first silicon semiconductor layer 4a on both sides of the gate electrode 33 in the transistor forming region 8a, and respective extension portions 37 of the source layer 35 and the drain layer 36 are formed on the respective gate electrode 33 sides with an impurity which is of the same type as that in the source layer 35 being diffused therein with a concentration lower than that of the source layer 35 (which will be referred to as a medium concentration).

A channel region 38 in which the P-type impurity that is opposite to that in the source layer 35 is diffused with a relatively low concentration and a channel of the nMOS element 31 is configured is formed in the first silicon semiconductor layer 4a between the respective extension portions 37 of the source layer 35 and the drain layer 36 below the gate oxide film 32.

The pMOS element 41 according to this embodiment has a source layer or region 45, a drain layer or region 46, and a gate electrode 43. The source layer 45 and the drain layer 46 are likewise formed in the transistor forming region 8b set in the first silicon semiconductor layer 4a having the large thickness with the impurity which is of a type opposite to that in the nMOS element 31. The gate electrode 43 faces a channel region 48 between respective extension portions 47 of the source layer 45 and the drain layer 46 to sandwich a gate oxide film 42 therebetween, and has a sidewall 34 on a side surface thereof.

The first and second P+ diffusion layers 12 and 22 of the first and second photosensitive element 11 and 21 and the source and drain layers 45 and 46 of the pMOS element 41 according to this embodiment are formed by diffusing the same P-type impurity with the same concentration.

Furthermore, the first and second N+ diffusion layers 14 and 24 of the first and second photosensitive elements 11 and 21 and the source and drain layers 35 and 36 of the nMOS element 31 are formed by diffusing the same N-type impurity with the same concentration.

Moreover, the first and second P− diffusion layers 15 and 25 of the first and second photosensitive elements 11 and 21 and the channel region 38 of the nMOS element 31 are formed by diffusing the same P-type impurity with the same concentration.

It is to be noted that the gate length direction means a direction extending from the source layer 35 or 45 toward the drain layer 36 or 46 in parallel with the top face of the first silicon semiconductor layer 4a or an opposite direction.

In FIGS. 3A-3D, 4A-4D, and 5A-5D, reference numeral 51 denotes a resist mask as a mask member which is a mask pattern formed by exposing and developing a positive type or negative type resist applied to the silicon semiconductor layer 4 based on photolithography, and the resist mask functions as a mask in etching or ion implantation according to this embodiment.

A manufacturing method for a photo IC according to this embodiment will now be explained based on steps indicated by P in FIGS. 3 to 6.

The silicon semiconductor layer 4 of the semiconductor wafer according to this embodiment is formed with the thickness 354 nm equal to that of the first silicon semiconductor layer 4a by forming a sacrificial oxide film by a thermal oxidation method on a thin silicon layer of the semiconductor wafer having the SOI structure formed on a buried oxide film 3 by a SIMOX (Separation by Implanted Oxygen) method while leaving the thin silicon layer or of the semiconductor wafer having the SOI structure formed by bonding the thin silicon layer on the buried oxide film 3.

At P1 (FIG. 3A), a pad oxide film having a small film thickness is formed by the thermal oxidation method on the silicon semiconductor layer 4 of the semiconductor wafer having the silicon semiconductor layer 4 with a predetermined thickness (35 nm in this embodiment) formed on the buried oxide film 3, a silicon nitride film composed of a silicon nitride is formed on the pad oxide film by a CVD (Chemical Vapor Deposition) method, and the resist mask (not shown) which covers the first diode forming regions 6a and 6b and the transistor forming regions 8a and 8b, i.e., in which the exposed element isolating region 10 is exposed is formed on the silicon nitride film based on photolithography. This is used as a mask to remove the silicon nitride film based on anisotropic etching so that the pad oxide film is exposed.

The resist mask is removed, the exposed silicon nitride film is used as a mask, and the silicon semiconductor layer 4 in the element separating region 10 is oxidized to form the element isolating layer 9 reaching the buried oxide film 3 based on a LOCOS (Local Oxidation Of Silicon) method. The silicon nitride film and the pad oxide film are removed by wet etching to form the element isolating layer 9 in each element isolating region 10 of the silicon semiconductor layer 4.

Additionally, a silicon nitride film 53 made of a silicon nitride is formed on the silicon semiconductor layer 4 by the CVD method, and a resist mask 51 in which the second diode forming region 6b is exposed is formed on the silicon nitride film 53 based on photolithography. This is used as a mask to remove the silicon nitride film 53 based on anisotropic etching, thereby exposing the silicon semiconductor layer 4 in the second diode forming region 6b.

At P2 (FIG. 3B), the resist mask 51 formed at the step P1 is removed, and a sacrificial oxide film 54 is formed on the silicon semiconductor layer 4 in the second diode forming region 6b by the thermal oxidation method.

At P3 (FIG. 3C), the sacrificial oxide film 54 is removed by wet etching and the silicon nitride film 53 is immersed in hot phosphoric acid to be removed thereby forming the second silicon semiconductor layer 4b having a thickness of 10 nm as a thickness of the silicon semiconductor layer 4 in the second diode forming region 6b.

As a result, the silicon semiconductor layer 4 covered with the silicon nitride film 53 in the regions other than the second diode forming region 6b is formed as the first silicon semiconductor layer 4a.

At P4 (FIG. 3D), the resist mask 51 in which the first diode forming region 6a and the transistor forming region 8a of the first silicon semiconductor layer 4a and the second diode forming region 6b of the second silicon semiconductor layer 4b are exposed is formed based on photolithography. This is used as a mask to implant a P-type impurity ion in the exposed first and second silicon semiconductor layers 4a and 4b, thereby forming the first P-diffusion layer 15 of the first photosensitive element 11 and the channel region 38 of the nMOS element 31 having the P-type impurity diffused therein with a relatively low concentration in the first silicon semiconductor layer 4a and also forming the second P− diffusion layer 25 of the second photosensitive element 21 having the P-type impurity diffused therein with a relatively low concentration in the second silicon semiconductor layer 4b.

At P5 (FIG. 4A), the resist mask 51 formed at the step P4 is removed, and the resist mask 51 in which the transistor forming region 8b of the first silicon semiconductor layer 4a is exposed is again formed based on photolithography. This is used as a mask to implant an N-type impurity ion into the exposed first silicon semiconductor layer 4a, thereby forming the channel region 48 of the pMOS element 41 having the N-type impurity diffused therein with a relatively low concentration in the first silicon semiconductor layer 4a in the transistor forming region 8b.

At P6 (FIG. 4B), the top faces of the first and second silicon semiconductor layers 4a and 4b are oxidized based on the thermal oxidation method to form a silicon oxide film 55, and polysilicon is deposited on the silicon oxide film 55 by the CVD method to form a polysilicon layer 56 having a relatively large film thickness.

At P7 (FIG. 4C), a resist mask (not shown) which covers regions where the gate electrodes 33 and 43 are formed at the central parts of the transistor forming regions 8a and 8b in the gate length direction is formed on the polysilicon layer 56 based on photolithography. This is used as a mask to etch the polysilicon layer 56 and the silicon oxide film 55 based on, e.g., dry etching, the gate electrodes 33 and 43 facing the channel regions 38 and 48 in the first silicon semiconductor layer 4a through the gate oxide films 32 and 42 are formed, and the resist mask is removed.

At P8 (FIG. 4D), the resist mask 51 in which regions where the first and second N+ diffusion layers 14 and 24 in the first and second diode forming regions 6a and 6b (the parts having the shape like "E" depicted in FIG. 1) and the transistor forming region 8a are exposed is formed based on photolithography. This is used as a mask to implant an N-type impurity ion into the exposed first and second silicon semiconductor layers 4a and 4b and the polysilicon in the gate electrode 33, thereby forming the extension portions 37 of the nMOS element 31 having the N-type impurity diffused therein with a medium concentration in the first silicon semiconductor layer 4a on both sides of the gate electrode 33 and diffusing the N-type impurity having a medium concentration in the gate electrode 33 and the first and second silicon semiconductor layers 4a and 4b in the regions where the first and second N+ diffusion layers 14 and 24 are formed.

At P9 (FIG. 5A), the resist mask 51 formed at the step P8 is removed, and the resist mask 51 in which regions where the first and second P+ diffusion layers 12 and 22 are formed (the parts having the shape like "π" depicted in FIG. 1) in the first and second diode forming regions 6a and 6b and the transistor forming region 8b are exposed is formed based on photolithography. This is used as a mask to implant a P-type impurity ion in the exposed first and second silicon semiconductor layers 4a and 4b and the polysilicon in the gate electrode 43, thereby forming the extension portions 47 of the pMOS element 41 having the P-type impurity diffused therein with a medium concentration in the first silicon semiconductor layer 4a on both sides of the gate electrode 43 and diffusing the P-type impurity having the medium concentration in the gate electrode 43 and the first and second silicon semiconductor layers 4a and 4b in the regions where the first and second P+ diffusion layers 12 and 22 are formed.

At P10 (FIG. 5B), the resist mask 51 formed at the step P9 is removed, and a silicon nitride is deposited on the entire surfaces of the gate electrodes 33 and 43 and the first and second silicon semiconductor layers 4a and 4b by the CVD method to form a silicon nitride film. The silicon nitride film is etched based on anisotropic etching to expose the top faces of gate electrodes 33 and 43 and the top faces of the first and second silicon semiconductor layers 4a and 4b, and the sidewall 34 is formed on side surfaces of the gate electrodes 33 and 43.

At P11 (FIG. 5C), the same resist mask 51 as that at the step P8 is formed based on photolithography. This is used as a mask to implant an N-type impurity ion into the exposed first and second silicon semiconductor layers 4a and 4b and the polysilicon in the gate electrode 33, thereby forming the source layer 35 and the drain layer 36 of the nMOS element 31 having the N-type impurity diffused therein with a relatively high concentration in the first silicon semiconductor layer 4a on both sides of the sidewall 34 and also forming the first and second N+ diffusion layers 14 and 24 of the first and second photosensitive elements 11 and 21 in the first and second silicon semiconductor layers 4a and 4b. Further, the N-type impurity is diffused in the gate electrode 33 with a relatively high concentration.

At P12 (FIG. 5D), the resist mask 51 formed at the step P11 is removed, and the same resist mask 51 as that at the step P9 is formed based on photolithography. This is used as a mask to implant a P-type impurity ion in the exposed first and second silicon semiconductor layers 4a and 4b and the polysilicon in the gate electrode 43, thereby forming the source layer 45 and the drain layer 46 of the pMOS element 41 having the P-type impurity diffused therein with a relatively high concentration in the first silicon semiconductor layer 4a on both sides of the sidewall 34 and also forming the first and second P+ diffusion layers 12 and 22 of the first and second photosensitive elements 11 and 21 in the first and second silicon semiconductor layers 4a and 4b. Furthermore, the P-type impurity is diffused in the gate electrode 43 with a relatively high concentration.

At P13 (FIG. 6), the resist mask 51 formed at the step P12 is removed, and a heat treatment of activating each diffusion layer is performed to form the first and second photosensitive elements 11 and 21 and the nMOS element 31 and the pMOS element 41 according to this embodiment.

Thereafter, an insulating material, e.g., a silicon oxide is deposited with a relatively large thickness on the entire surfaces of the first and second silicon semiconductor layers 4a and 4b on, e.g., the element isolating layer 9 based on a CVD method, and the upper surface of the insulating material is flattened to form an interlayer insulating film. A resist mask (not shown) having opening portions where the interlayer insulating film in contact hole forming regions on the second P+ diffusion layer 22 and the second N+ diffusion layer 24 is exposed is formed on the interlayer insulating film based on photolithography. This is used as a mask to form contact holes reaching the second P+ diffusion layer 22 and the second N+ diffusion layer 24 through the interlayer insulating film based on anisotropic etching of selectively etching the silicon oxide. The resist mask is removed, then the contact holes are filled with an electroconductive material based on the CVD method or a sputtering method to form contact plugs, and the upper surfaces of the contact plugs are flattened to expose the upper surface of the interlayer insulating film.

Then, as in the above-explained process, the contact holes on the first P+ diffusion layer 12, the first N+ diffusion layer 14, the source layers 35 and 45, and the drain layers 36 and 46 are filled with the electroconductive material to form contact plugs, and the upper surfaces of the contact plugs are flattened to expose the upper surface of the interlayer insulating film.

Moreover, as in the above-explained process, the contact holes reaching the gate electrodes 33 and 43 are filled with an electroconductive material to form the contact plugs, and a flattening processing is carried out to form a photo IC 58 according to this embodiment.

In the first and second P− diffusion layers 15 and 25 of the thus formed first and second photosensitive elements 11 and 21, the same P-type impurity as that in the channel region 38 of the nMOS element 31 constituting the photo IC 58 is diffused with the same concentration. Therefore, at the step P4 of forming the channel region 38 of the nMOS element 31, the same resist mask 51 can be used to simultaneously form the channel region 38, thereby simplifying the manufacturing process of the photo IC 58.

Additionally, in the first and second N+ diffusion layers 14 and 24 of the first and second photosensitive elements 11 and 21, the same N-type impurity as that in the source layer 35 and the drain layer 36 of the nMOS element 31 constituting the photo IC 58 is diffused with the same concentration. Therefore, at the step P11 of forming the source layer 35 and the drain layer 36 of the nMOS element 31, the same resist mask 51 can be used to simultaneously form these layers, thereby simplifying the manufacturing process of the photo IC 58.

Further, the same P-type impurity as that in the source layer 45 and the drain layer 46 of the pMOS element 41 constituting the photo IC 58 is diffused in the first and second P+ diffusion layers 12 and 22 of the first and second photosensitive elements 11 and 21 with the same concentration. Therefore, at the step P12 of forming the source layer 45 and the drain layer 46 of the pMOS element 41, the same resist mask 51 can be used to simultaneously form these layers, thereby simplifying the manufacturing process of the photo IC 58.

Figure 10:
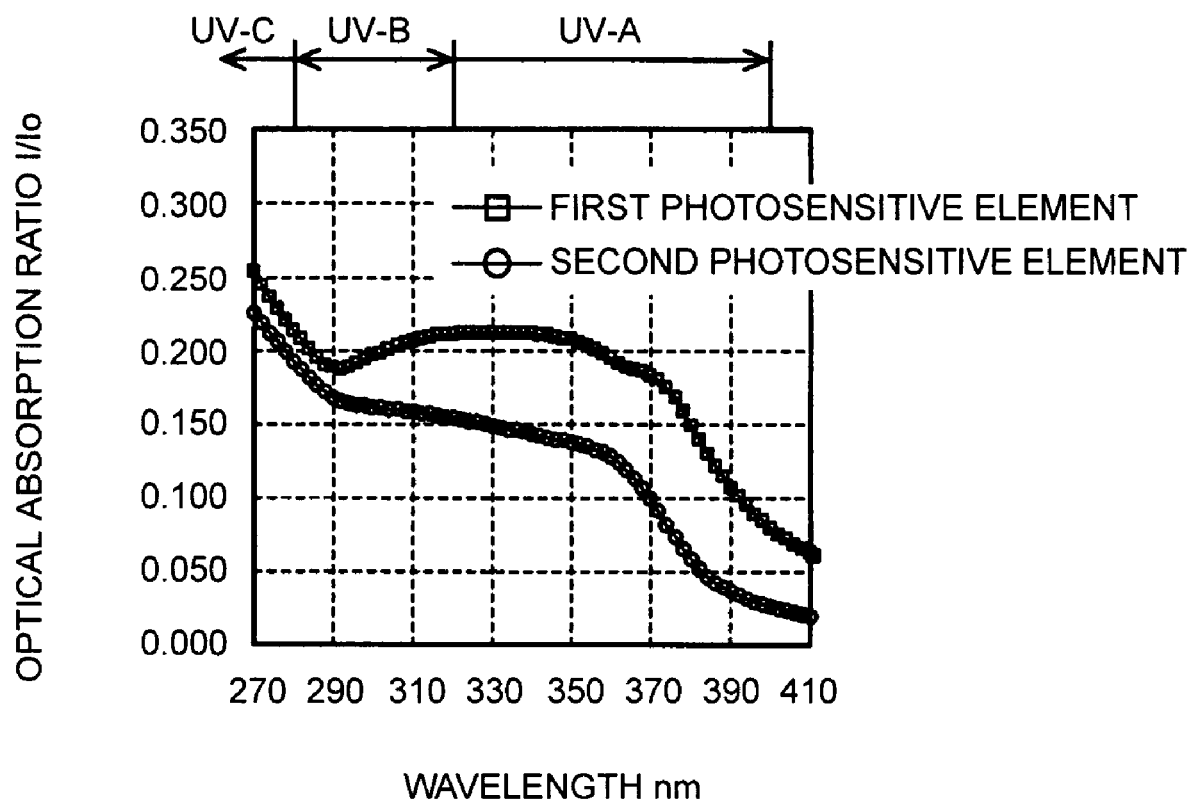
FIG. 10 is a graph showing an optical absorption ratio of each photosensitive element in the photodiode arrangement according to Embodiment 1.

FIG. 10 shows a result of calculating an optical absorption ratio I/Io with respect to a wavelength when the photodiode 1 formed of the first and second photosensitive elements 11 and 12 in which the first and second P– diffusion layers 15 and 25 have different thicknesses is uniformly irradiated with ultraviolet rays having all wavelengths in the ultraviolet range.

The thickness of the first P– diffusion layer 15 in the first photosensitive layer 11 used for the calculation is 35 nm, and the thickness of the second P– diffusion layer 25 in the second photosensitive element 21 used for the same is 10 nm.

As shown in FIG. 10, the first photosensitive element 11 (the thickness of the first P-type diffusion layer 15: 35 nm) and the second photosensitive element 21 (the thickness of the second P-type diffusion layer 25: 10 nm) according to this embodiment have different optical absorption characteristics. When these characteristics are utilized to perform the calculation based on, e.g., a difference, absolute values, a proportional multiple, or a combination of these outputs, a UV-A wave, a UV-B wave, and a UV-C wave (which will be referred to as an A wave, a B wave, and a C wave hereinafter) can be separated from each other to detect their intensities.

Figure 11A:
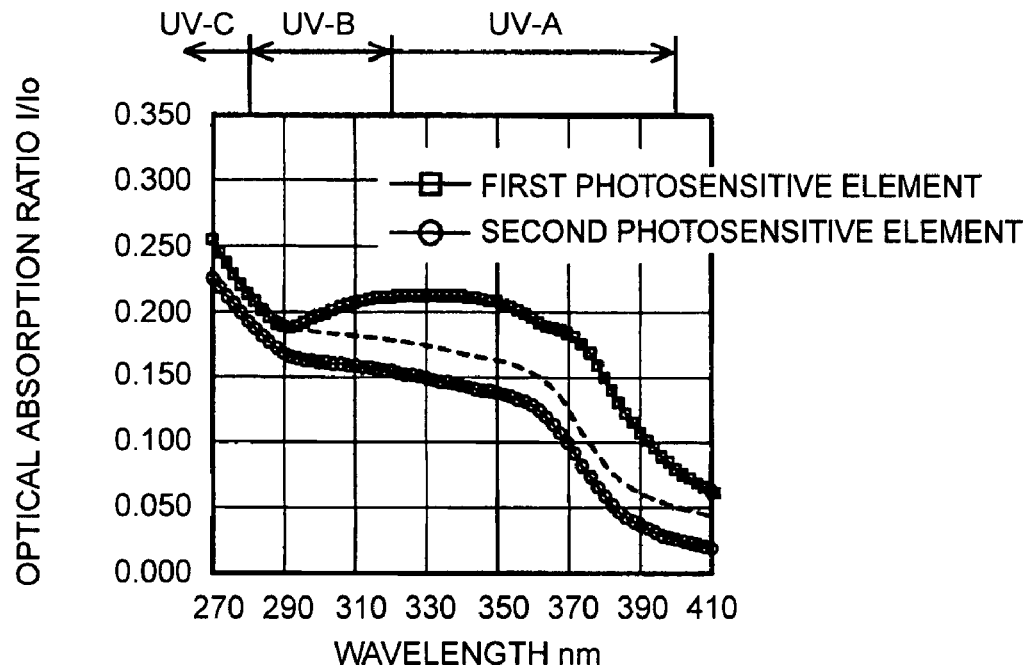
FIGS. 11A and 11B are explanatory drawings showing a detection method for an ultraviolet ray in each wavelength range in the photodiode arrangement according Embodiment 1.

That is, although the first and second photosensitive elements 11 and 21 are uniformly irradiated with the same ultraviolet rays having all the wavelengths, these elements have different optical absorption ratio characteristics because their silicon semiconductor layers 4 have different thicknesses. Therefore, as shown in FIG. 11A, when an output from the second photosensitive element 21 is multiplied by approximately 1.1 (a broken line shown in FIG. 11A) and the obtained result is subtracted from an output from the first photosensitive element 11, the C wave is canceled out and its difference is an output including approximately 5% of each of the A wave and the B wave.

When this difference is multiplied by approximately 20 to obtain an incident light intensity in a wavelength range where the A wave is combined with the B wave and this intensity is subtracted from an incident light intensity in the ultraviolet range obtained by multiplying the first photosensitive element 11 by approximately 5, an incident light intensity of the C wave can be obtained.

Figure 11B:
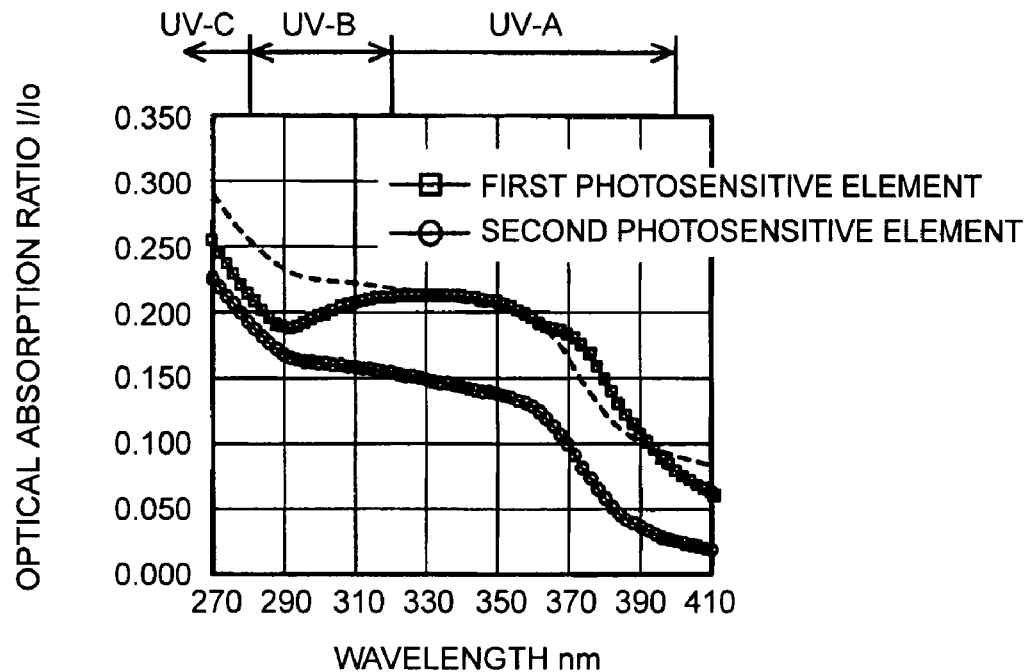

Further, as shown in FIG. 11B, when an output from the second photosensitive element 21 is multiplied by approximately 1.4 (a broken line shown in FIG. 11B) and the obtained result is subtracted from an output from the first photosensitive element 11, the A wave is canceled out and an absolute value of the obtained difference is an output including approximately 5% of each of the B wave and the C wave.

When the absolute value of this difference is multiplied by approximately 20 to acquire an incident light intensity in a wavelength range where the B wave is combined with the C wave and the obtained incident light intensity of the C wave is subtracted from this acquired incident light intensity, the resultant difference is an incident light intensity of the B wave.

Furthermore, when the incident light intensities of the B wave and the C wave from an incident light intensity in the ultraviolet range obtained by multiplying the first photosensitive element 11 by approximately 5, the difference is an incident light intensity of the A wave.

Figure 12:
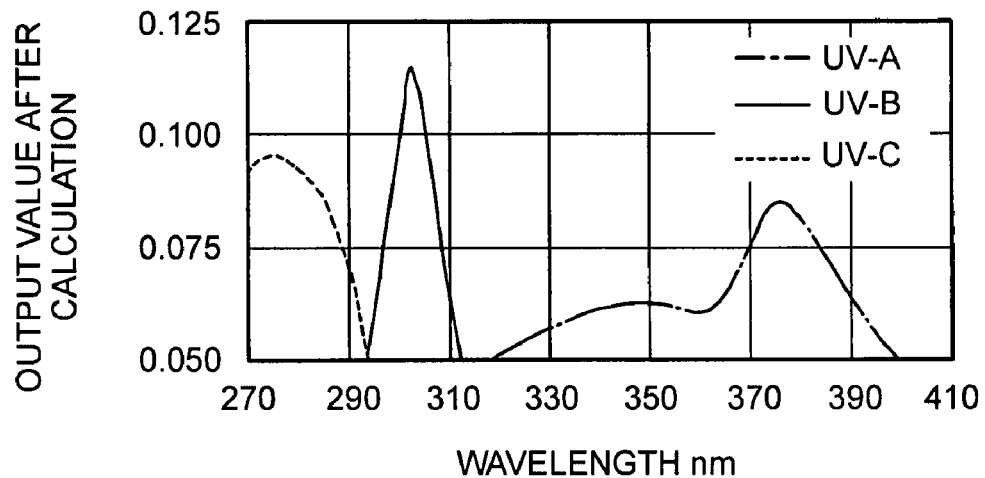
FIG. 12 is a graph showing output characteristics of the photodiode arrangement according to Embodiment 1.

FIG. 12 shows a result of obtaining each incident light intensity of each short wavelength interval like the above-explained calculation.

It can be understood from FIG. 12 that calculating outputs from the first and second photosensitive elements 11 and 21 having the two types of differences in the photodiode 1 according to this embodiment enables detecting respective intensities of the UV-A wave, the UV-B wave, and the UV-C wave in a state where these waves are separated from each other.

In this case, it is good enough to detect intensities in respective wavelength ranges of the outputs from the first and second photosensitive elements 11 and 21 in the photodiode 1 by converting a light generation current into a voltage by, e.g., a resistor, and converting this voltage into a digital value by, e.g., an A/D converter to be fetched, and calculating the obtained digital value by an arithmetic circuit provided in an external circuit.

As explained above, in this embodiment, the first and second photosensitive elements including the P+ diffusion layer and the N+ diffusion layer arranged to face each other with the P– diffusion layer sandwiched therebetween are formed on the first and second silicon semiconductor layers with the different thicknesses formed on the insulating layer. Therefore, the ultraviolet rays in the three wavelength ranges can be separated to obtain their intensities from the two types of outputs from the first and second photosensitive elements based on the calculation, thereby readily providing a photodiode which can separate the ultraviolet rays in the three wavelength ranges to detect their intensities.

Embodiment 2

Figure 13:
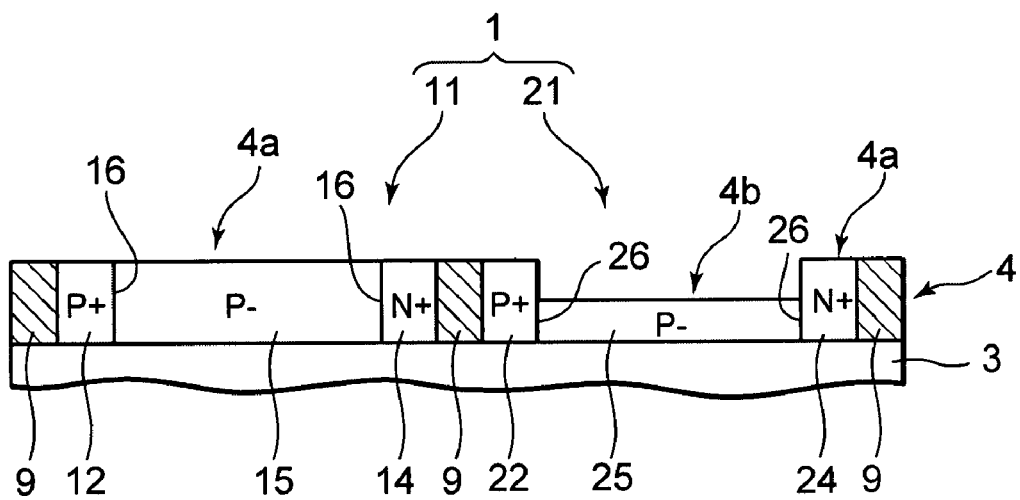
FIG. 13 is an explanatory drawing showing a cross section of a photodiode arrangement according to Embodiment 2.
Figure 17:
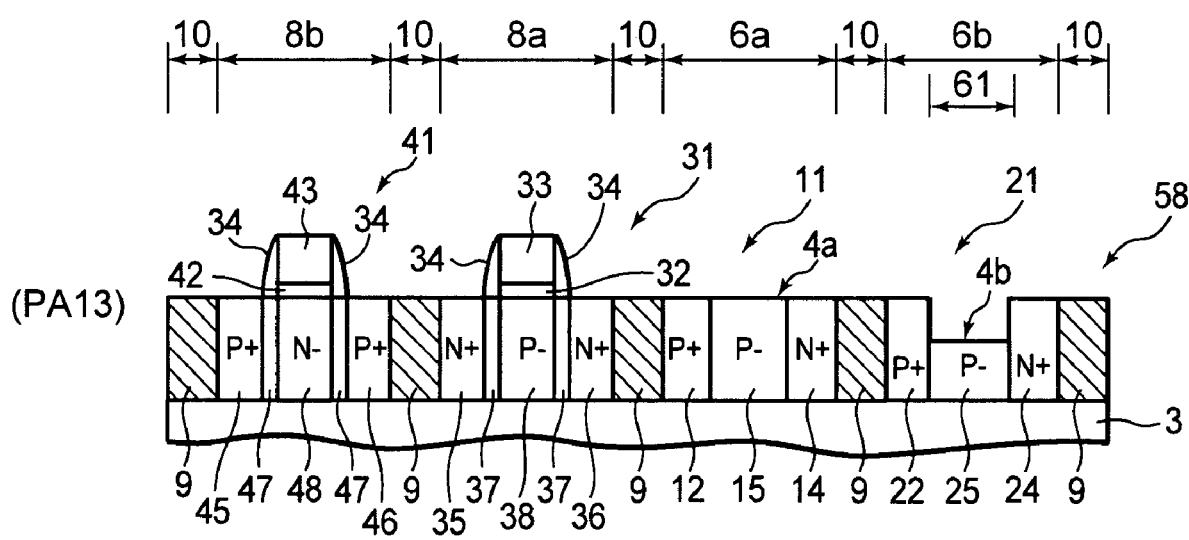
FIG. 17 illustrates step (PA13) in cross section of the manufacturing method of the photo IC according to Embodiment 2.

FIG. 13 is an explanatory drawing showing a cross section of a photodiode according to Embodiment 2, and FIGS. 14A-14D, 15A-15D, 16A-16D, and 17 are explanatory drawings showing a manufacturing method of a photo IC according to Embodiment 2.

It is to be noted that FIG. 13 is a cross-sectional view showing a cross section like FIG. 2 according to Embodiment 1, and a top face of the photodiode is the same as that in FIG. 1 according to Embodiment 1. Moreover, like reference numerals denote parts equal to those in Embodiment 1, thereby eliminating a need for an explanation thereof.

A second silicon semiconductor layer 4b having a small thickness according to this embodiment is formed in a second P– forming region 61 in a second P– diffusion layer 61 (which is a region sandwiched between the second P+ diffusion layer 22 having the shape like "π" and the second N+ diffusion layer 24 having the shape like "E" in the second transistor forming region 8b depicted in FIG. 1) alone of a second P– diffusion layer 25 as shown in FIGS. 14 to 17.

Therefore, as shown in FIG. 13, a second P+ diffusion layer 22 and a second N+ diffusion layer 24 according to this embodiment are formed with the same thickness as that of a first silicon semiconductor layer 4a.

In this case, the second silicon semiconductor layer 4b is set to have a thickness which is not smaller than 3 nm and less than 30 nm, and the first silicon semiconductor layer 4a is set to have a thickness which is not smaller than 30 nm and not greater than 50 nm.

The silicon semiconductor layer 4 is set to the thickness which is not smaller than 3 nm and not greater than 50 nm for the same reason as the Embodiment 1.

Figure 18:
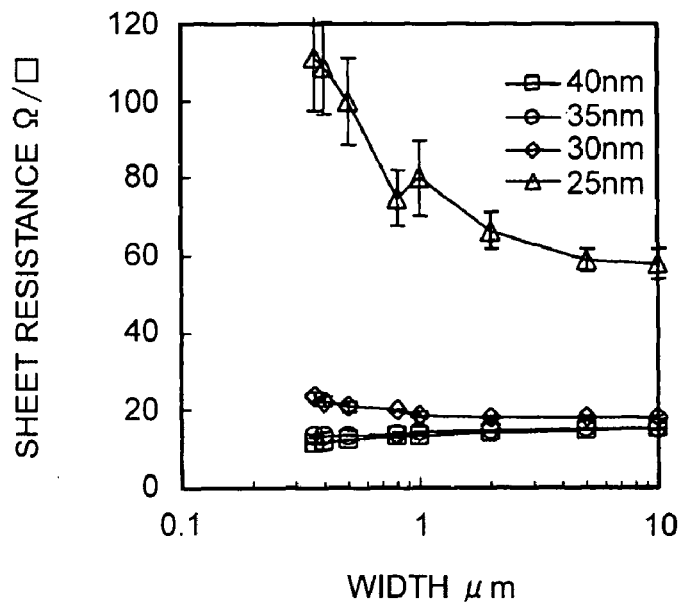
FIG. 18 is a graph showing a sheet resistance of a P+ diffusion layer according to Embodiment 2.
Figure 19:
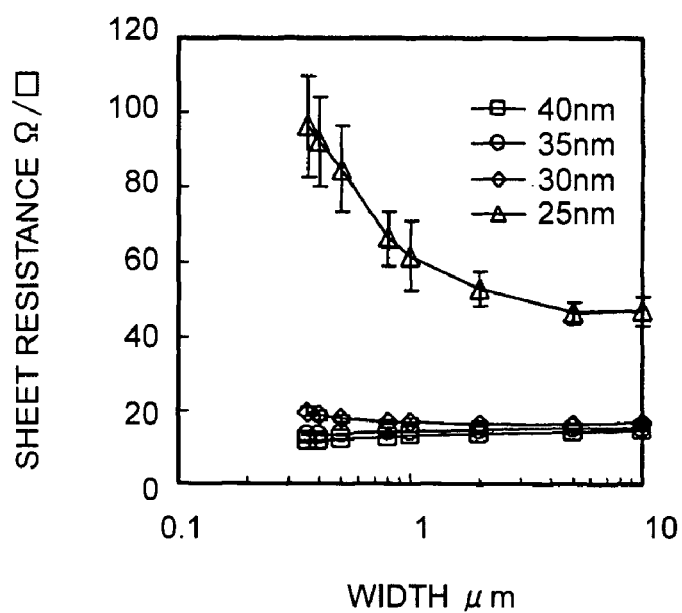
FIG. 19 is a graph showing a sheet resistance of an N+ diffusion layer according to Embodiment 2.

Each of the second P+ diffusion layer 22 and the second N+ diffusion layer 24 is set to the thickness which is not smaller than 30 nm when the second silicon semiconductor layer 4b is set to the thickness which is less than 30 nm because a sheet resistance is extremely increased and an output from a photosensitive element 21 is lowered in both a P+ diffusion layer depicted in FIG. 18 and an N+ diffusion layer shown in FIG. 19 when each of the second P+ diffusion layer 22 and the second N+ diffusion layer 24 is set to the thickness which is less than 30 nm.

It is to be noted that an abscissa in each of FIGS. 18 and 19 represents a width of the P+ diffusion layer or the N+ diffusion layer in a gate length direction, i.e., a width in the cross-sectional direction depicted in FIG. 13.

A manufacturing method of the photo IC according to this embodiment will now be explained with reference to steps indicated by PA in FIGS. 14 to 17.

The silicon semiconductor layer 4 of a semiconductor wafer according to this embodiment is formed with the same thickness 35 nm as that of the first silicon semiconductor layer 4a like Embodiment 1.

At PA1 (FIG. 14A), like the step P1 according to Embodiment 1, an element isolating layer 9 is formed in each element isolating region 10 of the silicon semiconductor layer 4, a silicon nitride film 53 composed of a silicon nitride is formed on the silicon semiconductor layer 4 by a CVD method, a resist mask 51 in which the second P− forming region 61 of a second diode forming region 6b is exposed is formed on the silicon nitride film 53 based on photolithography, and this is used as a mask to remove the silicon nitride film 53 based on anisotropic etching, thereby exposing the silicon semiconductor layer 4 in the second P− forming region 61.

At PA2 (FIG. 14B), the resist mask 51 formed at the step P1 is removed, and a sacrificial oxide film 54 is formed on the silicon semiconductor layer 4 in the second P− forming region 61 based on a thermal oxidation method.

At PA3 (FIG. 14C), the sacrificial oxide film 54 is removed by wet etching, the silicon nitride film 53 is removed by immersion in a hot phosphoric acid, thereby forming the second silicon semiconductor layer 4b in which the silicon semiconductor layer 4 in the second P− forming region 61 has a thickness of 10 nm.

As a result, the silicon semiconductor layer 4 covered with the silicon nitride film 53 in regions other than the second P− forming region 61 is formed as a first silicon semiconductor layer 4a.

At PA4 (FIG. 14D), a resist mask 51 in which the first diode forming region 6a and a transistor forming region 8a of the first silicon semiconductor layer 4a and the second diode forming region 6b of the second silicon semiconductor layer 4b are exposed is formed based on photolithography. This is used as a mask to form a first P− diffusion layer 15 of the first photosensitive element 11 and a channel region 38 of an nMOS element 31 and also form a second P− diffusion layer 25 of the second photosensitive element 21 having a P-type impurity diffused therein with a relatively low concentration in the second diode forming region 6b including the second silicon semiconductor layer 4b like the step P4 according to Embodiment 1.

At PA 5 (FIG. 15A), the resist mask 51 formed at step P4 is removed to form a channel region 48 of a pMOS element 41 as in step P5 according to Embodiment 1.

At PA6 (FIG. 15B), as in step P6 according to Embodiment 1, a silicon oxide film 55 is formed, and a polysilicon layer 56 is further formed on this film.

At PA7 (FIG. 15C), as in step P7 according to Embodiment 1, gate electrodes 33 and 43 facing the channel regions 38 and 48 of the first silicon semiconductor layer 4a through gate oxide films 32 and 42 are formed.

At PA8 (FIG. 15D), a resist mask 51 in which regions where the first and second N+ diffusion layers 14 and 24 in the first and second diode forming regions 6a and 6b are formed (parts having the shape like "E" shown in FIG. 1) are exposed is formed based on photolithography. This is used as a mask to implant an N-type impurity ion into the exposed first silicon semiconductor layer 4a and polysilicon in the gate electrode 33, thereby forming extension portions 37 of the nMOS element 31 having an N-type impurity diffused therein with a medium concentration in the first silicon semiconductor layer 4a on both sides of the gate electrode 33 and diffusing the N-type impurity with the medium concentration in the gate electrode 33 and the first silicon semiconductor layer 4a in the regions where the first and second N+ diffusion layers 14 and 24 are formed.

At PA9 (FIG. 16A), the resist mask 51 formed at step PA8 is removed, and a resist mask 51 in which regions where first and second P+ diffusion layers 12 and 22 in the first and second diode forming regions 6a and 6b are formed (parts having the shape like "π" depicted in FIG. 1) and the transistor forming region 8b are exposed is formed based on photolithography. This is used as a mask to implant a P-type impurity ion into the exposed first silicon semiconductor layer 4a and polysilicon in the gate electrode 43, thereby forming extension portions 47 of the pMOS element 41 having a P-type impurity diffused therein with a medium concentration in the first silicon semiconductor layer 4a on both sides of the gate electrode 43 and diffusing the P-type impurity with the medium concentration in the gate electrode 43 and the first silicon semiconductor layer 4a in the regions where the first and second P+ diffusion layers 12 and 22 are formed.

At PA10 (FIG. 16B), as for step P10 according to Embodiment 1, sidewalls 34 are formed on side surfaces of the gate electrodes 33 and 43.

At PA11 (FIG. 16C), the same resist mask as that at step PA8 is formed based on photolithography. This is used as a mask to implant an N-type impurity ion into the exposed first silicon semiconductor layer 4a and polysilicon in the gate electrode 33, thereby forming a source layer 35 and a drain layer 36 of the nMOS element 31 having the N-type impurity diffused therein with a relatively high concentration in the first silicon semiconductor layer 4a, also forming the first and second N+ diffusion layers 14 and 24 of the first and second photosensitive elements 11 and 21 in the first silicon semiconductor layer 4a, and diffusing the N-type impurity in the gate electrode 33 with a relatively high concentration.

At PA12 (FIG. 16D), the resist mask 51 formed at step PA11 is removed, and the same resist mask 51 as that at step PA9 is formed based on photolithography. This is used as a mask to implant a P-type impurity ion into the exposed first silicon semiconductor layer 4a and polysilicon in the gate electrode 43, thereby forming a source layer 45 and a drain layer 46 of the pMOS element 41 having the P-type impurity diffused therein with a relatively high concentration in the silicon semiconductor layer 4a on both sides of the sidewall 34 and the first and second P+ diffusion layers 12 and 22 of the first and second photosensitive elements 11 and 21 in the first silicon semiconductor layer 4a, and diffusing the P-type impurity in the gate electrode 43 with a relatively high concentration.

At PA13 (FIG. 17), the resist mask 51 formed at step PA12 is removed, and a heat treatment of activating each diffusion layer is performed, thereby forming the first and second photosensitive elements 11 and 21, the nMOS element 31, and the pMOS element 41 according to this embodiment.

Thereafter, an interlayer insulating film is formed like Embodiment 1, and a resist mask (not shown) having opening portions in which the first and second P+ diffusion layers 12 and 22, the first and second N+ diffusion layers 14 and 24, and the interlayer insulating film in contact hole forming regions on the source layers 35 and 45 and the drain layers 36 and 46 are exposed is formed on the interlayer insulating film based on photolithography. Like Embodiment 1, contact plugs reaching the respective diffusion layers are formed, and top faces of the contact plugs are flattened to expose a top face of the interlayer insulating film.

Then, as in the above explanation, the contact holes reaching the gate electrodes 33 and 43 are filled with an electro-conductive material to form contact plugs, and a flattening processing is carried out to form the photo IC 58 according to this embodiment.

The impurity which is of the same type as that in the respective diffusion layers of the nMOS element 31 and the pMOS element 41 is diffused with the same concentration in the respective diffusion layers of the thus formed first and second photosensitive elements 11 and 21 as in Embodiment 1. Therefore, at each forming step, the same resist mask 51 can be used to simultaneously form each layer, thereby simplifying the manufacturing process of the photo IC 58.

As explained above, even if the second P–diffusion layer 25 in the second photosensitive element 21 according to this embodiment has a thickness which is less than 30 nm, sheet resistance does not become excessive and output from the second photosensitive element 21 is not reduced since the second P+ diffusion layer 22 and the second N+ diffusion layer 25 are formed in the first silicon semiconductor layer 4a having a thickness which is not smaller than 30 nm.

Further, since the second P+ diffusion layer 22 and the second N+ diffusion layer 25 are formed in the first silicon semiconductor layer 4a on which the nMOS element 31 and the pMOS element 41 are formed, depth of each contact hole can be equal to the depth of the contact hole formed in the diffusion layer, e.g., the source layer and others, and the step of forming each contact plug can be simplified, thereby achieving simplification of the manufacturing process of the photo IC 58.

It is to be noted that the example where the thickness of the second P– diffusion layer 25 is less than 30 nm has been explained in this embodiment, but forming the second P+ diffusion layer 22 and the second N+ diffusion layer 25 in the silicon semiconductor layer 4a enables acquiring an effect of simplifying the process of forming each contact plug like the above example even if the thickness of the second P– diffusion layer 25 is not smaller than 30 nm.

As explained above, in this embodiment, in addition to the same effect as that of Embodiment 1, when the thickness of the second silicon semiconductor layer in which the second P– diffusion layer is formed is less than 30 nm, setting the thickness of each of the second P+ diffusion layer and the second N+ diffusion layer to 30 nm or above enables preventing a sheet resistance of the high-concentration diffusion layer in the second photosensitive element from becoming excessive, thereby avoiding a reduction in an output from the second photosensitive element.

Furthermore, forming the second P+ diffusion layer and the second N+ diffusion layer in the first silicon semiconductor layer enables setting the top faces of the second P+ diffusion layer and the second N+ diffusion layer on a level with the top faces of the source layer and the drain layer of an MOSFET, and the process of forming each contact plug can be simplified, thereby achieving simplification of the manufacturing process of the photo IC.

It is to be noted that the example where the low-concentration diffusion layer of the photosensitive element in the photodiode is formed in each of the silicon semiconductor layers having the two types of thicknesses has been explained in each embodiment, but this layer may be formed in each of the silicon semiconductor layers having three or more types of thicknesses.

Moreover, although the example where the P-type impurity is diffused to form the low-concentration diffusion layer has been explained in each embodiment, the same effect can be obtained when the N-type impurity is diffused with a relatively low concentration to form the low-concentration layer.

Additionally, although the P+ diffusion layer has the shape like "π" and the N+ diffusion layer has the shape like "E" in each embodiment, the shapes of these layers may be counter-changed, and the number of comb tooth portions may be increased.

Further, although the example where the plurality of comb tooth portions are provided in each of the P+ diffusion layer and the N+ diffusion layer and these layers are arranged in such a manner that the comb tooth portions mesh with each other has been explained in each embodiment, these layers may be arranged in such a manner that the peak portions alone face each other to sandwich the low-concentration diffusion layer without providing the comb tooth portions.

Furthermore, the example where the silicon semiconductor layer is the silicon semiconductor layer formed on the buried oxide film as the insulating layer of the SOI substrate has been explained in each embodiment. However, the silicon semiconductor layer may be, e.g., a silicon semiconductor layer of an SOS (Silicon On Sapphire) substrate formed on a sapphire substrate as an insulating layer or may be a silicon semiconductor layer of an SOQ (Silicon On Quartz) substrate formed on a quartz substrate as an insulating layer.

It is understood that various other modifications will be apparent to and can be readily made by those skilled in the art without departing from the scope and spirit of the present invention. Accordingly, it is not intended that the scope of the claims appended hereto be limited to the description set forth above but rather that the claims be construed as encompassing all of the features of patentable novelty which reside in the present invention, including all features which would be treated as equivalents thereof by those skilled in the art to which the invention pertains.

What is claimed is:

1. A photodiode arrangement, comprising:
an insulating layer; and
a silicon semiconductor layer having a plurality of portions with different thicknesses disposed on the insulating layer,
wherein each of the portions of the silicon semiconductor layer has a low-concentration diffusion region formed by diffusing one of a P-type impurity or an N-type impurity therein with a low concentration, a P-type high-concentration diffusion region formed by diffusing a P-type impurity therein with a high concentration, and an N-type high-concentration diffusion region formed by diffusing an N-type impurity therein with a high concentration,
wherein the P-type high-concentration diffusion region and the N-type high-concentration diffusion region formed in each portion of the silicon semiconductor layer are arranged to face each other, with the low-concentration diffusion region of the respective portion of the silicon semiconductor layer being interposed therebetween, and
wherein the low concentration diffusion region of one of the portions of the silicon semiconductor layer has a thickness which is less than a predetermined thickness, and each of the P-type high-concentration diffusion region and the N-type high-concentration diffusion region of that portion has the predetermined thickness, which ranges from 30 nm to 50 nm.

2. The photodiode arrangement according to claim 1, wherein in each portion of the silicon semiconductor layer, the P-type high-concentration diffusion region and the N-type high-concentration diffusion region in that portion have thicknesses which are the same.

3. The photodiode arrangement according to claim 2, wherein the plurality of portions of the silicon semiconductor layer have thicknesses which range from 3 nm to 50 nm.

4. The photodiode arrangement according to claim 1, wherein the plurality of portions of the silicon semiconductor layer have thicknesses which range from 3 nm to 50 nm.

5. The photodiode arrangement according to claim 1, wherein the P-type high-concentration diffusion region and the N-type high-concentration diffusion region in each portion have interdigitated comb-tooth projections.

6. A photodiode arrangement according to claim 1, wherein the low-concentration diffusion region, the P-type high-concentration diffusion region, and the N-type high-concentration diffusion region are included in a photodiode forming region, and the photodiode forming region is surrounded by an element isolating layer.

7. A photodiode arrangement, comprising:
an insulating layer;
a silicon semiconductor layer disposed on the insulating layer, the silicon semiconductor layer having first and second portions and the second portion having a thickness which is less than that of the first portion;
a first photosensitive element which is formed in the first portion of the silicon semiconductor layer and in which a first P-type high-concentration diffusion region having a P-type impurity diffused therein with a high concentration and a first N-type high-concentration diffusion region having an N-type impurity diffused therein with a high concentration are arranged to face each other, with a first low-concentration diffusion region having one of a P-type impurity or an N-type impurity diffused therein with a low concentration being interposed therebetween; and
a second photosensitive element in which a second P-type high-concentration diffusion region having a P-type impurity diffused therein with a high concentration and a second N-type high-concentration diffusion region having an N-type impurity diffused therein with a high concentration are arranged to face each other, with a second low-concentration diffusion layer having one of a P-type impurity or an N-type impurity diffused therein with a low concentration being interposed therebetween,
wherein the second P-type high-concentration diffusion region and the second N-type high-concentration diffusion region are formed in the first portion of the silicon semiconductor layer, and
wherein the second low-concentration diffusion layer is formed in the second portion of the silicon semiconductor layer.

8. The photodiode arrangement according to claim 7, wherein each of the first and second portions of the silicon semiconductor layer has a thickness ranging from 3 nm to 50 nm.

9. The photodiode arrangement according to claim 7, wherein the first portion of the silicon semiconductor layer has a thickness ranging from 30 nm to 50 nm, and the second portion of the silicon semiconductor layer has a thickness ranging from 3 nm to 30 nm.

10. The photodiode arrangement according to claim 7, wherein the first P-type high-concentration diffusion region and the first N-type high-concentration diffusion region have interdigitated comb-tooth projections, and the second P-type high-concentration diffusion region and the second N-type high-concentration diffusion region likewise have interdigitated comb-tooth projections.

11. A photodiode arrangement according to claim 7, wherein the first photosensitive element and the second photosensitive element are surrounded by an element isolating layer respectively.

12. A photodiode arrangement, comprising:
an insulating layer;
a silicon semiconductor layer disposed on the insulating layer and having a first portion and a second portion that is insulated from the first portion, a first photosensitive element being fabricated on the first portion of the silicon semiconductor layer and a second photosensitive element being fabricated on the second portion of the silicon semiconductor layer, each of the first and second photosensitive elements including a P-type high-concentration diffusion region, an N-type high-concentration diffusion region, and a low-concentration doped diffusion region between the P-type and N-type high-concentration diffusion regions,
wherein the first portion of the silicon semiconductor layer has a first thickness at the low-concentration doped diffusion region of the first photosensitive element and the second photosensitive element has a second thickness at the low-concentration doped diffusion region of the second photosensitive element, the second thickness being smaller than the first thickness, and
wherein the P-type high-concentration diffusion region and the N-type high-concentration diffusion region of the first photosensitive element have the first thickness, and the P-type high-concentration diffusion region and the N-type high-concentration diffusion region of the second photosensitive element likewise have the first thickness.

13. A photodiode arrangement according to claim 12, wherein the first thickness ranges from 30 nm to 50 nm and the second thickness ranges from 3 nm to 30 nm.

14. A photodiode arrangement according to claim 12, wherein the first photosensitive element and the second photosensitive element are surrounded by an element isolating layer respectively.

* * * * *